United States Patent
Qian et al.

(10) Patent No.: US 12,330,189 B2
(45) Date of Patent: Jun. 17, 2025

(54) INTERCONNECTION FOR MONOLITHICALLY INTEGRATED STACKED DEVICES AND METHODS OF FORMING THEREOF

(71) Applicant: GLOBALFOUNDRIES Singapore Pte. Ltd., Singapore (SG)

(72) Inventors: You Qian, Singapore (SG); Rakesh Kumar, Singapore (SG)

(73) Assignee: GLOBALFOUNDRIES SingaporePte. Ltd., Singapore (SG)

( * ) Notice: Subject to any disclaimer, the term of this patent is extended or adjusted under 35 U.S.C. 154(b) by 441 days.

(21) Appl. No.: 16/799,880

(22) Filed: Feb. 25, 2020

(65) Prior Publication Data

US 2021/0260623 A1  Aug. 26, 2021

(51) Int. Cl.
| | |
|---|---|
| *B06B 1/06* | (2006.01) |
| *B81B 3/00* | (2006.01) |
| *B81C 1/00* | (2006.01) |

(52) U.S. Cl.
CPC .......... *B06B 1/0666* (2013.01); *B81B 3/0021* (2013.01); *B81C 1/00246* (2013.01); *B81B 2201/0271* (2013.01); *B81B 2203/0127* (2013.01); *B81B 2207/015* (2013.01); *B81B 2207/07* (2013.01); *B81C 2203/0735* (2013.01)

(58) Field of Classification Search
CPC .. B06B 1/0666; B06B 3/0021; B81C 1/00246
See application file for complete search history.

(56) References Cited

U.S. PATENT DOCUMENTS

| | | | |
|---|---|---|---|
| 6,552,471 B1 | 4/2003 | Chandran et al. | |
| 7,248,131 B2 * | 7/2007 | Fazzio | H03H 9/0557 29/25.35 |
| 9,437,802 B2 | 9/2016 | Li | |
| 9,466,531 B2 | 10/2016 | Freeman et al. | |
| 10,189,705 B1 | 1/2019 | Campanella Pineda et al. | |
| 10,988,376 B2 * | 4/2021 | Qian | H01L 41/29 |

(Continued)

OTHER PUBLICATIONS

CMOS as defined in EE Comprehensive Dictionary, Edited by Laplante, CRC Press (2000).*

(Continued)

*Primary Examiner* — Nathan W Ha
(74) *Attorney, Agent, or Firm* — VIERING JENTSCHURA & PARTNER MBB

(57) ABSTRACT

A monolithic integrated device may include a first device having a complementary metal-oxide-semiconductor (CMOS) substrate, and a second device arranged over the CMOS substrate. The second device may include a first conductive element, and a second conductive element arranged over the first conductive element. A via opening may extend through the first conductive element and the second conductive element of the second device to an interconnect of the CMOS substrate. A via contact may be arranged in the via opening to contact the first conductive element, the second conductive element, and the interconnect of the CMOS substrate. The via contact electrically connects the first conductive element and the second conductive element of the second device to the interconnect of the CMOS substrate.

20 Claims, 23 Drawing Sheets

(56) References Cited

U.S. PATENT DOCUMENTS

| | | | |
|---|---|---|---|
| 2013/0119469 A1* | 5/2013 | Iwamatsu | H01L 27/1116 |
| | | | 257/E27.06 |
| 2013/0278111 A1 | 10/2013 | Sammoura et al. | |
| 2015/0206810 A1* | 7/2015 | Hou | H01L 25/50 |
| | | | 257/621 |
| 2015/0357375 A1 | 12/2015 | Tsai et al. | |
| 2017/0110504 A1 | 4/2017 | Panchawagh et al. | |
| 2017/0368574 A1 | 12/2017 | Sammoura et al. | |
| 2019/0177160 A1 | 6/2019 | Qian et al. | |
| 2020/0235038 A1* | 7/2020 | Adusumilli | G02B 6/30 |
| 2021/0260623 A1* | 8/2021 | Qian | B06B 1/0662 |

OTHER PUBLICATIONS

Copyright Page of EE Comprehensive Dictionary, Edited by Laplante, CRC Press (2000).*
Duan et al., "Wireless uncooled infrared detectors based on thinfilm piezoelectric MEMS resonators", Sensors, 2017, 3 pages, IEEE.

* cited by examiner

200

200

300

300

300

400

400

400

400

500

500

500

700

701

702

800a  800b 801a          801b 802a          802b

900

910

INTERCONNECTION FOR MONOLITHICALLY INTEGRATED STACKED DEVICES AND METHODS OF FORMING THEREOF

TECHNICAL FIELD

The present disclosure relates generally to monolithic integrated devices, and more particularly to interconnections for the monolithic integrated devices.

BACKGROUND

Monolithically integrated devices, such as a piezoelectric micromachined ultrasonic transducer (PMUT) monolithically integrated with a CMOS, have various applications, including mobile device and medical diagnostic applications. Design and fabrication of the integrated devices involves various considerations such as reduced or smaller footprint, interconnection to the CMOS, maximized performance for sending and receiving signals, amongst other design factors. For example, a PMUT may include a device layer vertically arranged over the CMOS in some configurations of the device to achieve a smaller footprint. The device layer may be formed, for example, by a piezoelectric layer sandwiched between a top electrode and a bottom electrode. A plurality of via contacts may be arranged respectively in various levels of the integrated device to provide electrical connection between the different metal layers of the device layer and the integrated circuit. In other words, individual vias are required to provide interconnection for each metal layer of the PMUT. Interconnects formed by damascene process in CMOS back-end-of-line is not an option for interconnecting the metal layers of the stacked devices. For example, chemical mechanical polishing on a piezoelectric layer/piezoelectric seed layer will affect the crystal quality and thickness uniformity. Furthermore, space for forming such via is also limited.

From the foregoing discussion, it is desirable to provide an improved interconnection for monolithic integrated devices, and methods of forming thereof.

SUMMARY

Embodiments generally relate to monolithic integrated devices and method for forming the monolithic integrated devices. According to various embodiments, a monolithic integrated device may include a first device having a complementary metal-oxide-semiconductor (CMOS) substrate, and a second device arranged over the CMOS substrate. The second device may include a first conductive element, and a second conductive element arranged over the first conductive element. A via opening may extend through the first conductive element and the second conductive element of the second device to an interconnect of the CMOS substrate. A via contact may be arranged in the via opening to contact the first conductive element, the second conductive element, and the interconnect of the CMOS substrate. The via contact electrically connects the first conductive element and the second conductive element of the second device to the interconnect of the CMOS substrate.

According to another embodiment, a method of forming a monolithic integrated device is provided. The method may include providing a second device over a first device having a complementary metal-oxide-semiconductor (CMOS) substrate. The second device may include a first conductive element, and a second conductive element arranged over the first conductive element. A via opening extending through the first conductive element and the second conductive element of the second device to an interconnect of the CMOS substrate may be formed. A via contact may be formed in the via opening to contact the first conductive element, the second conductive element, and the interconnect of the CMOS substrate. The via contact electrically connects the first conductive element and the second conductive element of the second device to the interconnect of the CMOS substrate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following:

FIG. 7A shows an exemplary top view of a via design of a via opening based on existing design rule; while

FIG. 8A show exemplary top and side views of a via opening based on existing design rule; while

DETAILED DESCRIPTION

Figure 1A:
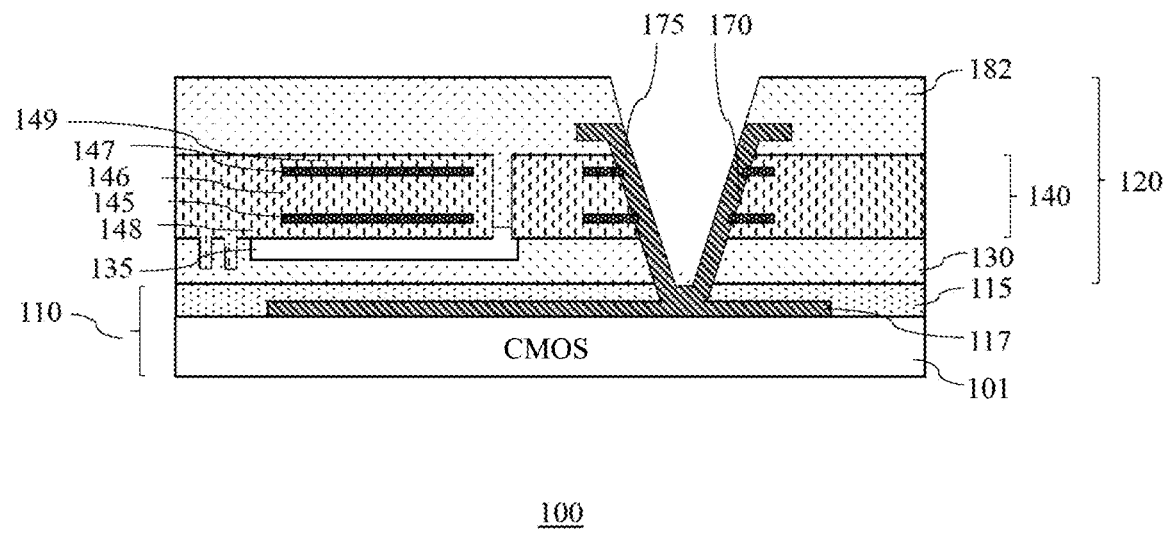
FIGS. 1A-1E show simplified cross-sectional views of embodiments of a device.

The following detailed description refers to the accompanying drawings that show, by way of illustration, specific details and embodiments in which the embodiments may be practiced. These embodiments are described in sufficient detail to enable those skilled in the art to practice the embodiments. Other embodiments may be utilized and structural, logical, and electrical changes may be made without departing from the scope of the invention. The various embodiments are not necessarily mutually exclusive, as some embodiments can be combined with one or more other embodiments to form new embodiments.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Embodiments of the present disclosure generally relate to monolithic integrated devices. According to various embodiments, a monolithic integrated device may include a first device and a second device arranged over the first device. The first device may include, or may be, a complementary metal-oxide-semiconductor (CMOS) substrate or wafer. The second device may include a first conductive element, and a second conductive element arranged over the first conductive element. The monolithic integrated device may further include a via opening extending through the first conductive element and the second conductive element of the second device to an interconnect of the CMOS substrate. A via contact may be arranged in the via opening to contact the first conductive element, the second conductive element, and the interconnect of the CMOS substrate. The via contact may electrically connect the first conductive element and the second conductive element of the second device to the interconnect of the CMOS substrate.

The first conductive element may be referred to as a first electrode or first metal layer while the second conductive element may be referred to as a second electrode or second metal layer of a device layer of the second device herein. In a non-limiting example, the first conductive element may be a patterned bottom electrode, and the second conductive element may be a patterned top electrode of the second device. According to various embodiments, the second device may further include additional conductive elements arranged over the first conductive element and the second conductive element, where the via opening further extends through one or more of the additional conductive elements, and the via contact may further contact one or more of the additional conductive elements.

According to various embodiments, the via contact may line the via opening.

According to various embodiments, the via opening may include at least a first via width at a first via level and a second via width at a second via level, where the first via width is different from the second via width. According to various embodiments, the first via width may extend to the interconnect of the CMOS substrate. The second via width may be wider than the first via width and may extend to a top surface of the first conductive element. The via opening may further include a third via width wider than the second via width extending to a top surface of the second conductive element.

According to various embodiments, the via opening may further include at least one extension region to increase a contact area of at least one of the first conductive element and the second conductive element for the via contact.

According to various embodiments, the second device may be a transducer such as a piezoelectric micromachined ultrasonic transducer (PMUT) vertically arranged over the CMOS substrate.

According to various embodiments, the second device may be a sensor. Other types of devices for the second device, such as memory or photonic devices may also be used for stacking over the first device. For example, the second device may be, or include, a memory die or a photonic die.

For purpose of illustration, the second device may be described in the context of a MEMS component, however, it should be understood that other types of devices may be applicable for stacking over the first device. The MEMS component (the second device) may include a device layer. The device layer may include at least one piezoelectric stack having a first electrode, a piezoelectric layer arranged over the first electrode, and a second electrode arranged over the piezoelectric layer. A via opening may extend to an interconnect of the CMOS substrate. The via opening may extend through the first electrode and the second electrode in the device layer. A via contact may be arranged in the via opening to contact the first electrode, the second electrode, and the interconnect of the CMOS substrate. The via contact electrically connects the electrodes of the device layer to the interconnect in the CMOS substrate. In some embodiments, the via contact may be a multi-layer via contact having additional contact area. The via contact may be arranged in a via opening having at least one extension region as will be described.

FIGS. 1A-1E show simplified cross-sectional views of embodiments of a device 100. The device 100 may be a monolithic integrated device. Referring to FIG. 1A, the monolithically integrated device may include a first device 110 and a second device 120 arranged over the first device 110. The first device 110 may include a CMOS substrate (or CMOS device substrate or CMOS device). The CMOS substrate may include electronic components and interconnects formed therein (not illustrated in the interest of brevity). The first device 110 (e.g., CMOS substrate) may further include an interlevel dielectric layer 115 surrounding the interconnects. The interlevel dielectric layer 115 may be an insulating layer such as an oxide layer. The interlevel dielectric layer 115 may be a silicon dioxide layer, in a non-limiting example. The interconnects may include a contact pad or top metal of the first device 110, which may be referred to as CMOS interconnect 117. The interconnect 117 may be arranged over a lower layer (e.g., base layer) 101 of the first device 110. The lower layer 101 is processed using CMOS technology.

The second device 120, such as a MEMS component in a non-limiting example, may be arranged over the first device 110. The second device 120 may include an interposer layer 130 and a device layer 140.

The device layer 140 may include a first surface and a second surface. The first surface and the second surface may be opposing surfaces. For example, the first surface may be a top surface while the second surface may be a bottom surface of the device layer. Alternatively, the first surface may be a bottom surface, while the second surface may be a top surface of the device layer. The device layer 140 may be a flexible membrane arranged over the CMOS substrate.

According to various embodiments, the device layer 140 may be an acoustic layer for transducing electrical signals into mechanical or acoustic waves. The device layer 140, for example, may vibrate above a device cavity 135 in response to a voltage applied to conductive elements (e.g., electrodes) of the device layer 140. According to various embodiments, the device layer 140 may be a piezoelectric stack. For example, the piezoelectric stack may include a first electrode 145, a piezoelectric layer 146 arranged over the first electrode, and a second electrode 147 arranged over the piezoelectric layer. The first electrode 145 may be a patterned bottom electrode of the piezoelectric stack, while the second electrode 147 may be a patterned top electrode of the piezoelectric stack. The bottom and top electrodes may be patterned depending on design requirements.

In some embodiments, the piezoelectric stack may further include a seed layer 148 arranged below the first electrode 145 and the piezoelectric layer 146. The seed layer 148, for example, may be formed of piezoelectric material. The piezoelectric stack may further include a buffer layer 149 arranged over the second electrode 147 and the piezoelectric layer 146. The buffer layer 149 may be formed of a piezoelectric material or a non-piezoelectric material. In other embodiments, the piezoelectric stack may be provided without the seed layer and/or the buffer layer. In a non-limiting example, the piezoelectric layer 146, the seed layer 148, and the buffer layer 149 may include, or may be formed, from aluminum nitride (AlN), scandium aluminum nitride (ScAlN), lead zirconate titanate (PZT), polyvinylidene fluoride (PVDF), any other thin-film piezoelectric material, or combinations thereof. In a non-limiting example, the first electrode and the second electrode in the piezoelectric stack may be formed of a conductive material such as, inter alia, molybdenum (Mo), tungsten (W), aluminum (Al), platinum (Pt), other suitable metals, or combinations thereof.

As illustrated in FIG. 1A, the interposer layer 130 may be arranged between the device layer 140 and the first device 110 (e.g., CMOS substrate). The interposer layer 130 may be, or include, a dielectric layer such as an oxide layer, in a non-limiting example. The interposer layer 130 and the interlevel dielectric 115 may be formed of the same or different dielectric material. The device cavity 135 may be arranged in the interposer layer 130 below the device layer 140.

A via contact 175 may be disposed in the device layer 140 to electrically connect the conductive elements or electrodes of the device layer 140 (e.g., first electrode 145 and second electrode 147) to the interconnect 117 (e.g., top metal) in the first device 110 (e.g., CMOS substrate). The via contact 175 may be formed of conductive material such as aluminum (Al), copper (Cu), or a combination thereof, in a non-limiting example. Other types of conductive material, such as having low resistivity for example, may also be used.

A via opening 170 may extend to the interconnect 117 of the first device 110 (e.g., CMOS substrate), and the via contact 175 may be arranged in the via opening 170. For example, the via opening 170 may extend through a depth of the device layer 140 and the interposer layer 130. In some embodiments, the via opening 170 may extend partially through the interlevel dielectric layer 115 of the first device 110 (e.g., CMOS substrate) to reach the interconnect 117. As illustrated in FIG. 1A, the via opening 170 may extend through the piezoelectric stack. The via opening 170 may extend through the first electrode 145 (first conductive element) and second electrode 147 (second conductive element) of the second device 120. The via opening 170 exposes at least sidewalls of the electrodes in the piezoelectric stack to allow contact by the via contact 175.

According to various embodiments, portions of the piezoelectric material in the piezoelectric stack facing the via opening 170 may be receded with respect to the first electrode 145 and the second electrode 147, forming protruded electrode portions of the first electrode 145 and the second electrode 147 in the via opening 170. In such cases, top and bottom surfaces of the protruded electrode portions in addition to the sidewalls may be available for contact by the via contact 175. In other embodiments, the first electrode 145 and the second electrode 147 may not protrude into the via opening 170.

In various embodiments, the via contact 175 may line the via opening 170. For example, the via contact 175 may line sidewalls and a bottom of the via opening 170. In some embodiments, the via contact 175 may extend over a top surface of the device layer 140. As described, the via contact 175 may contact the first electrode 145 and the second electrode 147 of the piezoelectric stack and the interconnect 117 of the first device 110 (e.g., CMOS substrate). Accordingly, a single via in the device layer 140 (or the second device 120), which is formed by the via contact 175 in the via opening 170, may electrically connect the first electrode 145 and the second electrode 147 of the piezoelectric stack to the interconnect 117 of the first device 110 (e.g., CMOS substrate).

The first electrode 145 and the second electrode 147 of the piezoelectric stack may be patterned differently in various embodiments depending on design requirements, as long as the via opening 170 may extend through the electrodes to allow contact by the via contact 175 to the electrodes.

According to various embodiments, a passivation layer 182 may be arranged over the device layer 140. The passivation layer 182 may surround portions of the via contact 175 extending outside the via opening 170. The passivation layer 182 may be formed of a passivation material. In a non-limiting example, the passivation material may be a dielectric layer such as silicon dioxide layer.

Figure 1B:
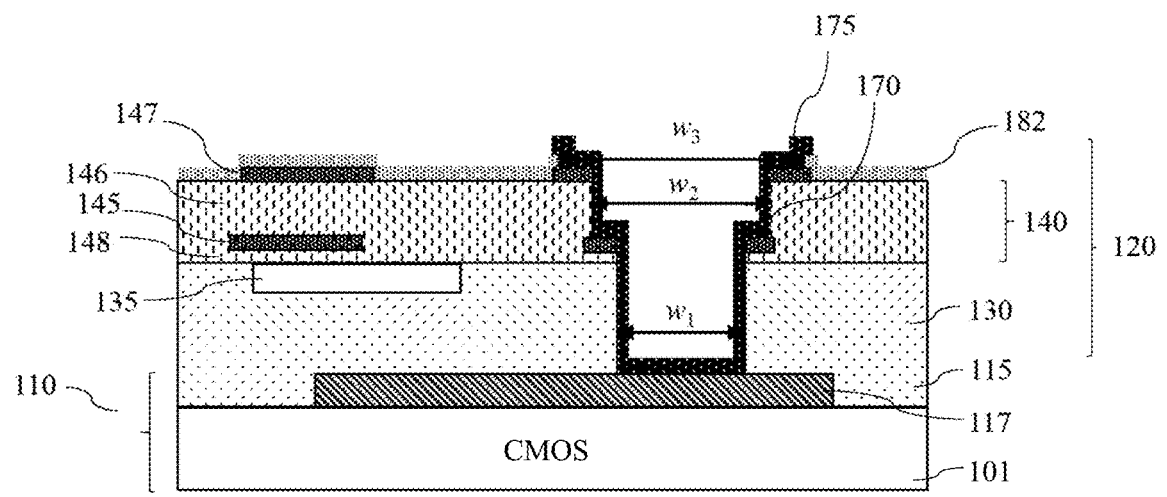

The example MEMS component as described in FIG. 1A may be a unimorph piezoelectric having a single active layer (e.g., single piezoelectric layer) as the device layer 140. Referring to FIG. 1B, another exemplary embodiment of the MEMS component is shown. The MEMS component as shown in FIG. 1B may be similar to that described with respect to FIG. 1A. As such, common elements may not be described or described in detail. For example, the MEMS component may include the interposer layer 130 and the device layer 140. The device layer 140 may be a piezoelectric stack having a first electrode 145, a piezoelectric layer 146 arranged over the first electrode, and a second electrode 147 arranged over the piezoelectric layer 146. The first electrode 145 may be a patterned bottom electrode of the piezoelectric stack, while the second electrode 147 may be a patterned top electrode of the piezoelectric stack. The bottom and top electrodes may be patterned depending on design requirements of the integrated device.

In some embodiments, the piezoelectric stack may further include a seed layer 148 arranged below the first electrode 145 and the piezoelectric layer 146.

According to various embodiments, a passivation layer 182 may be arranged over the second electrode 147 and the piezoelectric layer 146. The passivation layer 182 may surround portions of the via contact 175 extending outside the via opening 170.

The via contact 175 may be disposed in the device layer 140 and interposer layer 130 to electrically connect the electrodes of the device layer 140 (e.g., first electrode 145 and second electrode 147) to the interconnect 117 in the first device 110 (e.g., CMOS substrate).

The via opening 170 may extend to the interconnect 117 of the CMOS wafer, and the via contact 175 may be arranged in the via opening 170. For example, the via opening 170 may extend through a depth of the device layer 140 and the interposer layer 130. In some embodiments, the via opening 170 may extend partially through the interlevel dielectric layer 115 of the CMOS substrate to reach the interconnect 117. Similar to second device 120 as described with respect to FIG. 1A, the via opening 170 may extend through the first electrode 145 and the second electrode 147 of the piezoelectric stack. The via opening 170 exposes at least sidewalls of the electrodes in the piezoelectric stack to allow contact by the via contact 175. In some embodiments, the via opening 170 exposes top surfaces and sidewalls of the first electrode 145 and/or second electrode 147. Said differently, the top surface of a portion of at least one of the first electrode 145 and second electrode 147 may be available for contact by the via contact 175.

According to various embodiments, the via opening 170 may include at least a first via width $w_1$ at a first via level and a second via width $w_2$ at a second via level, where the first via width $w_1$ is different from the second via width $w_2$. According to various embodiments, the first via width $w_1$ extends to the interconnect 117 of the first device 110 (e.g. CMOS substrate). The second via width $w_2$ may be wider than the first via width $w_1$ and extends to a top surface of the first electrode 145 (e.g., bottom electrode). According to various embodiments, the via opening 170 may further include a third via width $w_3$. The third via width $w_3$ may be wider than the second via width $w_2$ and extends to a top surface of the second electrode 147 of the piezoelectric stack (e.g., top electrode). For example, the first via width $w_1$ may be defined by the interposer layer 130, the seed layer 148 and the first electrode 145. The second via width $w_2$ may be defined by the piezoelectric layer 146 and the second electrode 147. The third via width $w_3$ may be defined by the passivation layer 182.

According to various embodiments, the different via widths (e.g., first via width $w_1$, second via width $w_2$, third via width $w_3$) in the via opening 170 may be formed using different reticles. For example, the via opening 170 having the first via width $w_1$, second via width $w_2$, third via width $w_3$ may be formed using three different reticles. The via opening 170 having different via widths may be referred to as a nested via. For example, the via opening 170 may be three vias nested in one another. Providing the nested via enables a single via opening 170 which may allow interconnection between the electrodes of the device layer 140 (or second device 120) with the interconnect 170, which saves space in the monolithic integrated device as via size is an important consideration for device design.

Figure 1C:
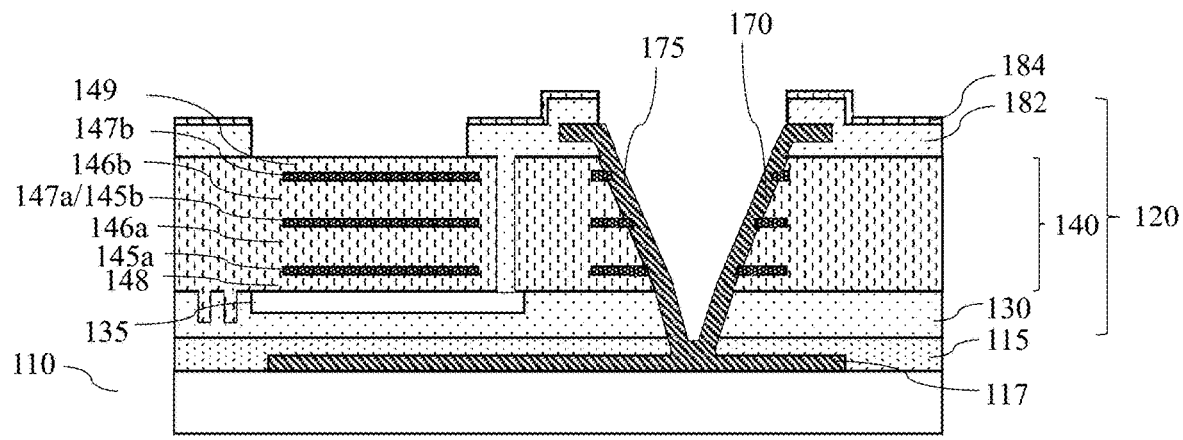
Figure 1D:
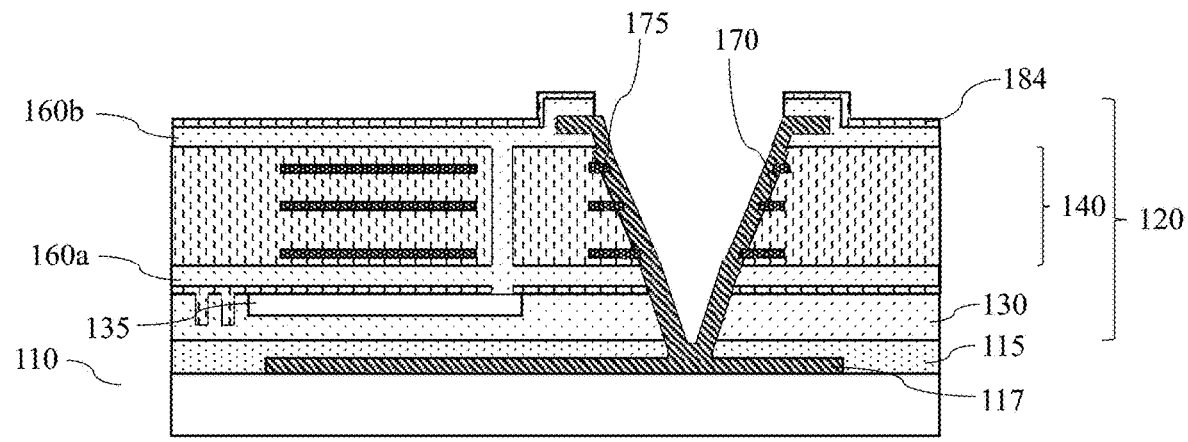
Figure 1E:
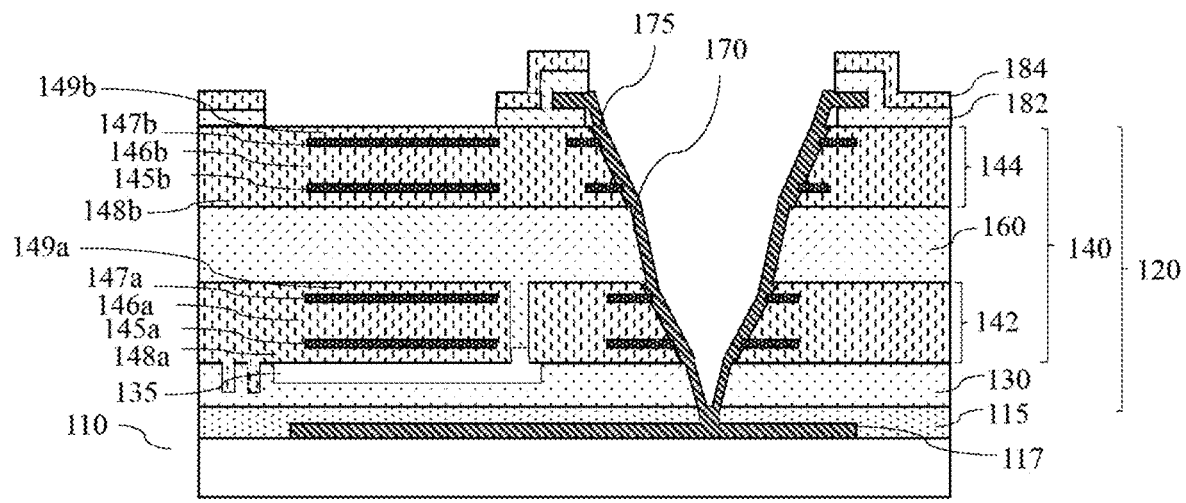

FIGS. 1C-1E show exemplary embodiments of the integrated device where the second device 120 may be a bimorph piezoelectric having two active layers (e.g., two piezoelectric layers) as the device layer 140. The second device 120 as shown in FIGS. 1C-1E may be similar to that described with respect to FIG. 1A. As such, common elements may not be described or described in detail.

In the case of a bimorph piezoelectric, the device layer 140 may include a first piezoelectric stack and a second piezoelectric stack. The first piezoelectric stack may include a first electrode 145a, a piezoelectric layer 146a arranged over the first electrode, and a second electrode 147a arranged over the piezoelectric layer 146a. The second piezoelectric stack may include a first electrode 145b, a piezoelectric layer 146b arranged over the first electrode, and a second electrode 147b arranged over the piezoelectric layer 146b. According to various embodiments, the second electrode 147a of the first piezoelectric stack and the first electrode 145b of the second piezoelectric stack may be a common electrode. The second electrode 147a and the first electrode 145b may be referred to as a middle electrode 147a/145b of the device layer 140. The middle electrode may be a patterned middle electrode of the device layer 140.

In some embodiments, the first piezoelectric stack may further include a seed layer 148 arranged below the first electrode 145a and the piezoelectric layer 146a. The seed layer 148, for example, may be formed of piezoelectric material. In some embodiments, the second piezoelectric stack may further include a buffer layer 149 arranged over the second electrode 147b and the piezoelectric layer 146b. The buffer layer 149 may be formed of a piezoelectric material or a non-piezoelectric material. In other embodiments, the seed layer and/or the buffer layer may not be formed in the device layer 140.

Similar to the second device 120 as described with respect to FIGS. 1A-1B, the via contact 175 may be disposed in the device layer 140 and interposer layer 130 to electrically connect the electrodes of the device layer 140 (e.g., first electrode 145a, middle electrode 147a/145b and second electrode 147b) to the interconnect 117 in the first device 110 (e.g., CMOS substrate).

The via opening 170 may extend to the interconnect 117 of the first device 110 (e.g., CMOS substrate), and the via contact 175 may be arranged in the via opening 170. For example, the via opening 170 may extend through a depth of the device layer 140 and the interposer layer 130. Said differently, the via opening 170 may extend through a depth of the first piezoelectric stack and the second piezoelectric stack and the interposer layer 130. In some embodiments, the via opening 170 may extend partially through the interlevel dielectric layer 115 of the first device 110 (e.g., CMOS substrate) to reach the interconnect 117. As illustrated in FIG. 1C, the via opening 170 may extend through the first electrode 145a, middle electrode 147a/145b and second electrode 147b of the device layer 140. The via opening 170 exposes at least sidewalls of the electrodes in the piezoelectric stack to allow contact by the via contact 175.

In some embodiments, the via opening 170 exposes top surfaces and sidewalls of the first electrode 145a, middle electrode 147a/145b and second electrode 147b. Said differently, the top surfaces of a portion of the first electrode 145a, middle electrode 147a/145b and second electrode 147b may be available for contact by the via contact 175.

A passivation layer 182 may be arranged over the device layer 140. The passivation layer 182 may be patterned to surround portions of the via contact 175 external to the via opening 170. A capping layer 184 may be arranged over the passivation layer 182. The capping layer 184 may be formed of a piezoelectric material, in a non-limiting example.

According to various embodiments, the MEMS component may include elastic layers arranged on a top surface and bottom surface of the device layer 140. As illustrated in FIG. 1D, a first elastic layer 160a may be arranged below the device layer 140, and a second elastic layer 160b may be arranged over the device layer 140. The elastic layers 160a, 160b may each be formed of an elastic material which allows flexural motion of the first piezoelectric stack and the second piezoelectric stack. Each of the elastic layers may be, or include, a dielectric layer. According to various embodiments, the elastic layer may be, or include, an oxide layer. In a non-limiting example, the oxide layer may be a silicon dioxide layer. A capping layer 184 may be arranged over the second elastic layer 160b.

According to various embodiments, the MEMS component may include an elastic layer arranged between the first piezoelectric stack and the second piezoelectric stack. Referring to FIG. 1E, the device layer 140 may include a first piezoelectric stack 142 and a second piezoelectric stack 144. The first piezoelectric stack 142 may include a first electrode 145a, a piezoelectric layer 146a arranged over the first electrode, and a second electrode 147a arranged over the piezoelectric layer. The second piezoelectric stack 144 may include a first electrode 145b, a piezoelectric layer 146b arranged over the first electrode, and a second electrode 147b arranged over the piezoelectric layer. The first electrodes 145a and 145b may be a patterned bottom electrodes of the first piezoelectric stack 142 and the second piezoelectric stack 144, respectively, while the second electrodes 147a and 147b may be patterned top electrodes of the first piezoelectric stack 142 and the second piezoelectric stack 144, respectively. The bottom and top electrodes may be patterned depending on design requirements of the integrated device.

In some embodiments, the first piezoelectric stack 142 and/or the second piezoelectric stack 144 may further include a seed layer (e.g., seed layers 148a, 148b) arranged below the first electrode (e.g., first electrode 145a, 145b) and the piezoelectric layer (e.g., piezoelectric layers 146a, 146b). The first piezoelectric stack 142 and/or the second piezoelectric stack 144 may further include a buffer layer (e.g., buffer layers 149a, 149b) arranged over the second electrode (e.g., second electrode 147a, 147b) and the piezoelectric layer (e.g., piezoelectric layers 146a, 146b). In other embodiments, the first piezoelectric stack 142 and/or the second piezoelectric stack 144 may be provided without the seed layer and/or the buffer layer.

An elastic layer 160 may be arranged between the first piezoelectric stack 142 and the second piezoelectric stack 144. As illustrated in FIG. 1E, the elastic layer 160 may be arranged in the center of the device layer 140. As described, the elastic layer 160 may be formed of an elastic material which allows flexural motion of the first piezoelectric stack 142 and the second piezoelectric stack 144.

The via opening 170 may extend to the interconnect 117 of the first device 110 (e.g., CMOS substrate), and the via contact 175 may be arranged in the via opening 170. For example, the via opening 170 may extend through a depth of the device layer 140 (i.e., first piezoelectric stack 142, second piezoelectric stack 144), as well as the elastic layer 160 arranged therein, and the interposer layer 130. In some embodiments, the via opening 170 may extend partially through the interlevel dielectric layer 115 of the first device 110 to reach the interconnect 117. As shown, the via opening 170 may extend through the first electrode 145b and second electrode 147b of the second piezoelectric stack 144 and the first electrode 145a and second electrode 147a of the first piezoelectric stack 142. The via opening 170 exposes at least sidewalls of the electrodes in the first piezoelectric stack 142 and second piezoelectric stack 144 to allow contact by a via contact 175. A passivation layer 182 may be arranged over the device layer 140. The passivation layer 182 may be patterned to surround portions of the via contact 175 external to the via opening 170. A capping layer 184 may be arranged over the passivation layer 182.

The via opening 170 and via contact 175 arranged in the via opening may be referred to as a multi-level via of the integrated device (e.g., two, three or four levels of electrodes of the device layer 140 connected to the interconnect 117 by the same via). Accordingly, a single via (e.g., one via opening 170 and one via contact 175) may be used to provide interconnection between the conductive elements (e.g., electrodes) of the second device and the CMOS top metal (e.g., interconnect 117) of the first device 110, rather than using three or more individual vias to provide interconnection for each metal layer (e.g., between the top and bottom electrodes of the second device with the CMOS top metal (e.g., interconnect 117) of the first device 110). This advantageously facilitates ease of design for the integrated device and process control. In some embodiments, the integrated device 100 may include one or more additional via openings 170 arranged in a via region adjacent to a device area or region of the second device, and respective via contacts 175 may be arranged therein. For example, two or more via openings 170 may be arranged adjacent to a device area of the second device as each via opening 170 may be formed with a small width, and respective via contacts 175 may be formed in the via region.

FIGS. 2A-2H show simplified cross-sectional views of embodiments of a process 200 for forming a device. The device, for example, is similar or the same as that shown and described in FIG. 1A. As such, common elements may not be described or described in detail.

According to various embodiments, a second device may be provided over a first device having a CMOS substrate. The second device may include a first conductive element, and a second conductive element arranged over the first conductive element. A via opening extending through the first conductive element and the second conductive element of the second device to an interconnect of the first device 110 (e.g., CMOS substrate) may be formed. A via contact may be formed in the via opening to contact the first conductive element, the second conductive element, and the interconnect of the first device 110 (e.g., CMOS substrate).

Figure 2A:
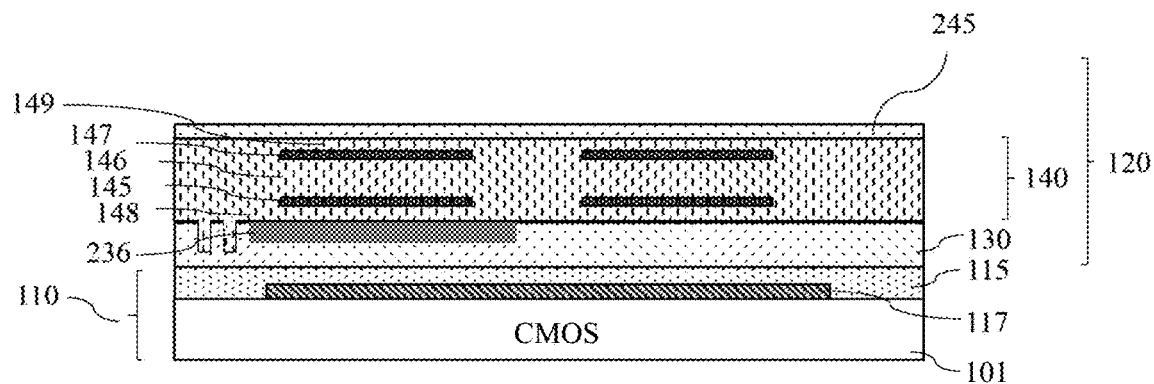
FIGS. 2A-2H show simplified cross-sectional views of embodiments of a process for forming a device.

As shown in FIG. 2A, a first device 110 having CMOS wafer or substrate may be provided. The first device 110 (e.g., CMOS substrate) may include electronic components and interconnects formed therein (not illustrated in the interest of brevity). The first device 110 may further include an interlevel dielectric layer 115 surrounding the interconnects. The interconnects may include a contact pad or top metal of the first device 110, which may be referred to as interconnect 117.

A second device 120, such as a MEMS component in a non-limiting example, may be formed over the first device 110. Forming the second device may include forming an interposer layer 130 and a device layer 140 over the first device 110. According to various embodiments, the interposer layer 130 may include a sacrificial layer 236 for forming a device cavity, in an example embodiment. According to various embodiments, forming the device layer 140 may include forming a piezoelectric stack having a seed layer 148, a first electrode 145 (first conductive element), a piezoelectric layer 146, a second electrode 147 (second conductive element), and a buffer layer 149. The first electrode 145 and the second electrode 147 may be patterned bottom and top electrodes of the piezoelectric stack. In other embodiments, the seed layer 148 and/or the buffer layer may not be formed. The process for forming the interposer layer 130 and the piezoelectric stack of the device layer 140 may include using four masks, in a non-limiting example. An etch stop or sacrificial layer 245 may be formed over the device layer 140. The etch stop layer 245 may serve as an etch stop for forming a via contact in the device layer 140. The etch stop layer 245 may include, or may be, a dielectric material such as a silicon dioxide, in a non-limiting example.

One or more via contacts may be formed in the second device to electrically connect the electrodes 145, 147 (conductive elements) of the device layer 140 to the interconnect 117 in the second device.

Figure 2B:
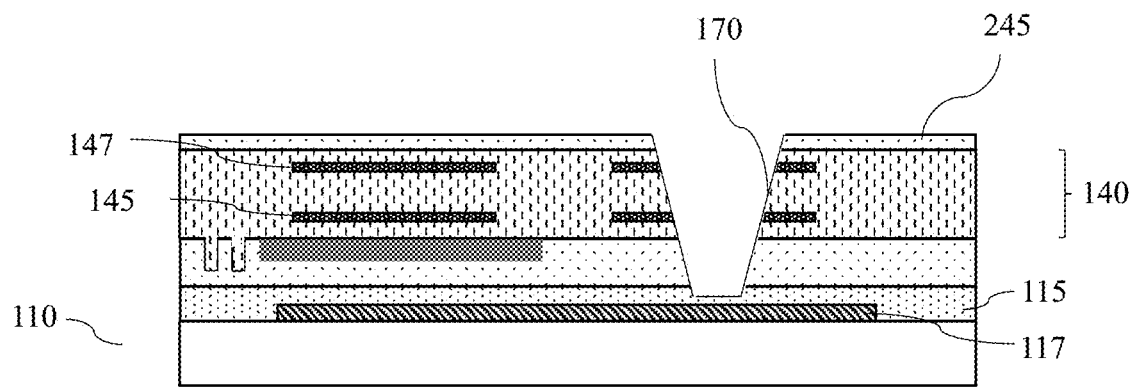

According to various embodiments, a via opening may be formed through the etch stop layer 245, the device layer 140 and the interposer layer 130. A via contact may be formed in the via opening to electrically connect the electrodes of the device layer to the interconnect 117. As shown in FIG. 2B, a via opening 170 may be formed to extend through the first electrode 145 and the second electrode 147 in the piezoelectric stack (or device layer 140). A first etch may be performed through the etch stop layer 245, the device layer 140 and the interposer layer 130 to form the via opening. The first etch may etch through the electrodes (e.g., first electrodes 145, second electrodes 147) in the piezoelectric stack to expose the electrodes. The first etch may be performed using a fifth mask (not illustrated). For example, the fifth mask may be a patterned photoresist. The first etch may leave some dielectric layer remaining over the interconnect 117 of the first device 110. The remaining dielectric layer may have a thickness of about 100 nm, in a non-limiting example. As illustrated in FIG. 2B, at least the sidewalls of the first electrode 145 and the second electrode 147 are exposed in the via opening 170.

Figure 2C:
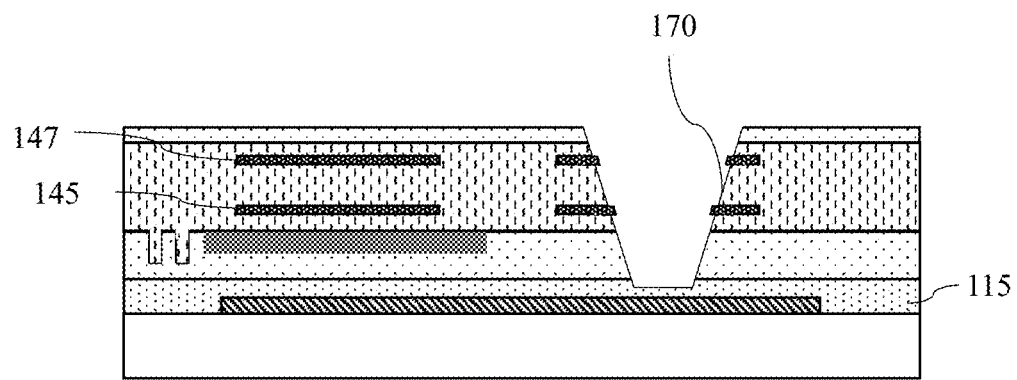

According to various embodiments, exposed surfaces of the conductive elements in the device layer 140 (e.g., first electrode 145 and the second electrode 147 of the piezoelectric stack) by the via opening 170 may be increased by removing additional piezoelectric material from the piezoelectric stack. In a non-limiting example, an isotropic etch may be performed to remove the additional piezoelectric material from the piezoelectric stack, forming protruded portions of the first electrode 145 and the second electrode 147 the via opening 170, as illustrated in FIG. 2C. As shown, surfaces (e.g., top, bottom and sidewall) of the protruded portion may be exposed. The increased exposed surfaces of the first electrode 145 and the second electrode 147 in the via opening 170 enable increased contact area with a subsequently deposited via contact. Accordingly, various embodiments provide improved contact between the conductive elements (e.g., electrodes) of the device layer and the via contact. The isotropic etch may be a wet etch using TMAH, in a non-limiting example. In other embodiments, the isotropic etch may not be required. In such cases, the contact or interface between the electrodes and the via contact may be at the sidewall of the electrodes exposed by the via opening 170.

Figure 2D:
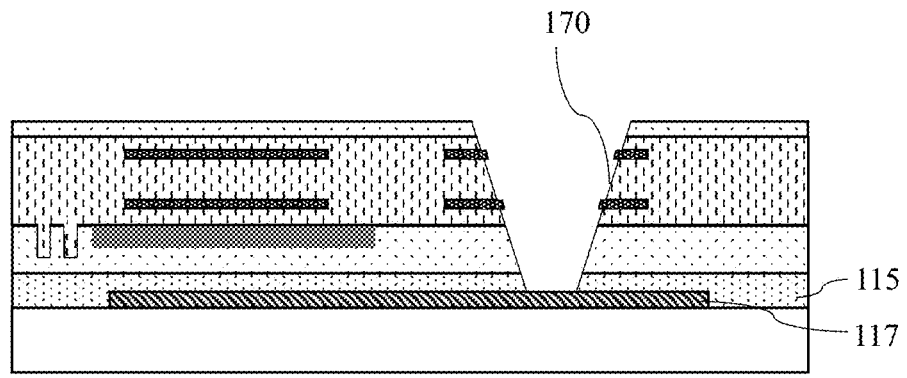

In a non-limiting embodiment, forming the via opening 170 may further include performing a second etch to expose the interconnect 117 (e.g., top metal) of the first device 110 (e.g., CMOS substrate), as shown in FIG. 2D. The second etch removes the remaining dielectric layer over the interconnect 117 and extends a depth of the via opening 170. The fifth mask may be removed after the via opening 170 extends or reaches the interconnect 117 of the first device 110 (e.g., CMOS substrate). The via opening 170 may be referred to as a multi-level via of the integrated device. As described, a single etch process and/or a single mask (e.g., the fifth mask) may be used for forming the via opening 170 in the device layer (or the MEMS component) which extends to the interconnect 117 (e.g., top metal) of the first device 110 (e.g., CMOS substrate). Accordingly, the via opening 170 may be formed with a relatively small width compared to conventional fabrication processes of integrated stacked devices. In a non-limiting embodiment, the via opening 170 may be formed with a small width such as less than about 9.2 um, in a non-limiting example.

Figure 2E:
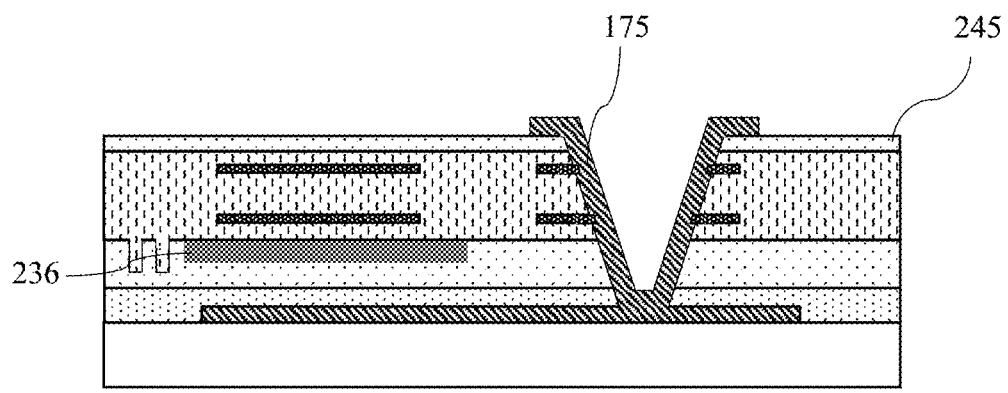

A conductive material may be deposited to line the via opening 170, as illustrated in FIG. 2E. The conductive material may be patterned, by etching using a sixth mask, forming the via contact 175. The etch stop layer 245 may be removed, exposing a top surface of the piezoelectric stack. The etch stop layer may be removed using an etch, such as vapor hydrofluoric acid (VHF) etch, in a non-limiting example.

Figure 2F:
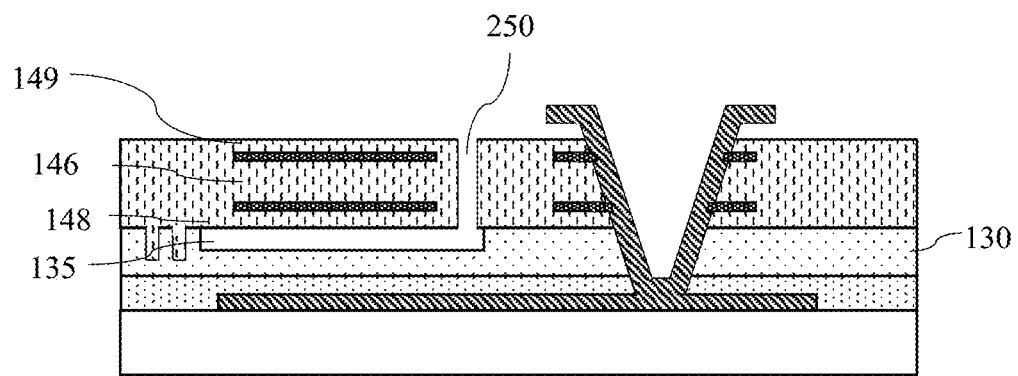

As illustrated in FIG. 2F, a release via 250 may be formed in the piezoelectric stack. The release via 250 may extend through a depth of the piezoelectric stack to expose the sacrificial layer. The release via 250 may extend through the buffer layer 149, the piezoelectric layer 146, and the seed layer 148. The release via 250 may be formed by etching through the buffer layer 149, the piezoelectric layer 146, and the seed layer 148 using a seventh mask. Dielectric material in the interposer layer 130 may also be removed so as to expose the sacrificial layer 236. A release etch may then be performed to remove the sacrificial layer, forming the device cavity 135 in the interposer layer 130.

Figure 2G:
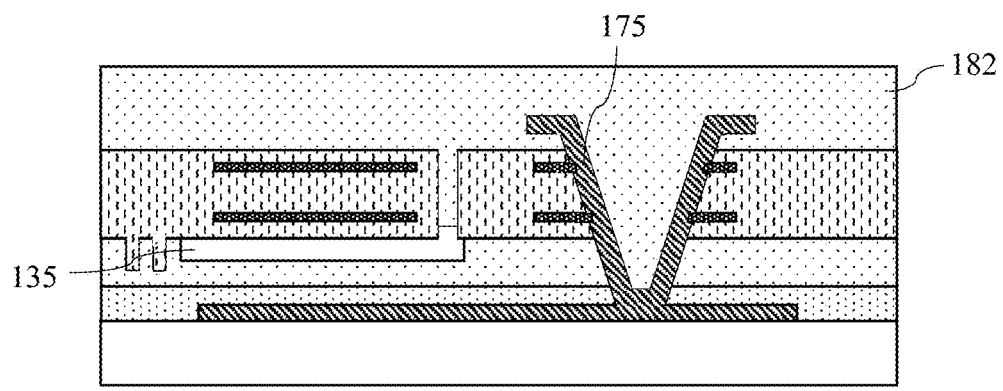
Figure 2H:
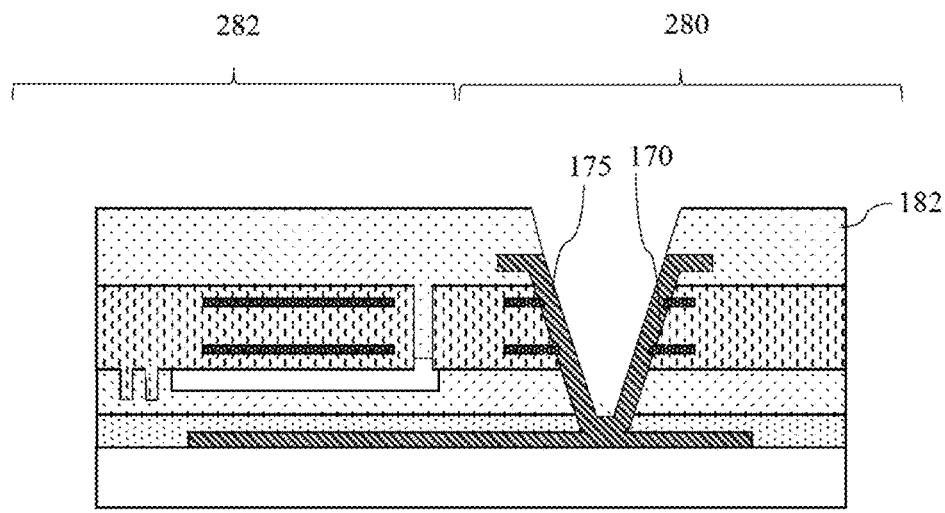

A passivation layer 182 may be formed over the device layer 140 (or the piezoelectric stack), as shown in FIG. 2G. The passivation layer 182 may be formed by depositing a passivation material over the piezoelectric stack and the release via 250. The passivation material may at least partially fill the release via 250. Accordingly, the passivation layer 182 may seal the release via 250. The passivation material may be deposited such that it does not fill the device cavity 135; said differently, the device cavity 135 may remain unfilled by the passivation material or any material so as to remain an empty space therein. The passivation layer 182 may be patterned to expose the via contact 175, as shown in FIG. 2H. For example, the passivation material may be etched using an eighth mask. The passivation layer 182 may be patterned using a short VHF etch process, in a non-limiting example. The passivation layer 182 may surround portions of the via contact 175 extending outside the via opening 170.

According to various embodiments, the process 200 may form one or more via openings 170 in a via region 280 adjacent to a device area/region 282 of the second device, and respective via contacts 175 in the via openings, as described in FIGS. 2B-2H. For example, the process 200 may form two or more via openings 170 adjacent to a device area of the device layer, and respective via contacts 175 in the via region 280 (not illustrated) as each via opening 170 may be formed with a small width. The via opening 170 and via contact 175 arranged in the via opening may be referred to as a multi-level via of the integrated device (e.g., two levels of conductive elements (electrodes) of the device layer connected to the interconnect 117 by the same via). Accordingly, a single via (e.g., one via opening 170 and one via contact 175) may be used to provide interconnection between the conductive elements (electrodes) of the device layer and CMOS top metal.

As described, the process 200 may form the second device such as the MEMS component without performing CMP during fabrication of the piezoelectric stack. For example, the via opening and via contact may be formed in the device layer after all the film deposition (e.g., formation of the seed layer, piezoelectric layer and buffer layer of the second piezoelectric stack).

FIGS. 3A-3H show simplified cross-sectional views of embodiments of another process 300 for forming a device. The device, for example, is similar or the same as that shown and described in FIG. 1C, and the process 300 may be similar to the process 200 as described above. As such, common elements may not be described or described in detail.

Figure 3A:
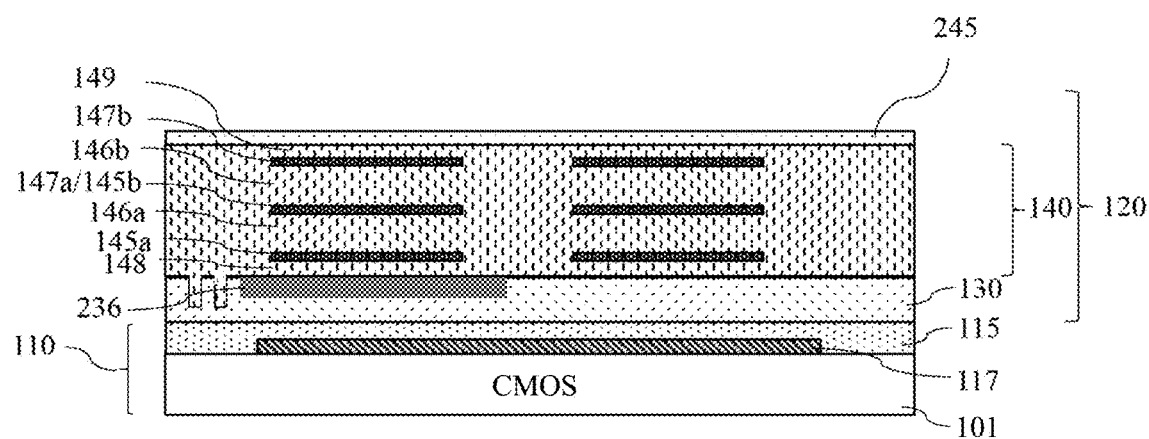
FIGS. 3A-3H show simplified cross-sectional views of embodiments of another process for forming a device.

As shown in FIG. 3A, a first device 110 including a CMOS wafer or substrate may be provided. Similar to process 200, a second device 120 (e.g., MEMS component) may be formed over the first device 110. The device layer 140 may be different from that described in FIG. 2A in that it is a bimorph piezoelectric.

The device layer 140 may include a first piezoelectric stack and a second piezoelectric stack. The first piezoelectric stack may include a first electrode 145a, a piezoelectric layer 146a arranged over the first electrode, and a second electrode 147a arranged over the piezoelectric layer 146a. The second piezoelectric stack may include a first electrode 145b, a piezoelectric layer 146b arranged over the first electrode, and a second electrode 147b arranged over the piezoelectric layer 146b. According to various embodiments, the second electrode 147a of the first piezoelectric stack and the first electrode 145b of the second piezoelectric stack may be a common electrode. The second electrode 147a and the first electrode 145b may be referred to as a middle electrode 147a/145b of the device layer 140. In some embodiments, the first piezoelectric stack may further include a seed layer 148 arranged below the first electrode 145a and the piezoelectric layer 146a. In some embodiments, the second piezoelectric stack may further include a buffer layer 149 arranged over the second electrode 147b and the piezoelectric layer 146b. The process for forming the interposer layer 130 and the first and second piezoelectric stack of the device layer 140 may include five masks, in a non-limiting example.

An etch stop layer 245 may be formed over the device layer 140. The etch stop layer 245 may serve as an etch stop for forming a via contact in the device layer 140.

Similarly, one or more via contacts may be formed in the device layer 140 to electrically connect the electrodes 145a, 147a/145b, 147b of the device layer 140 to the interconnect 117 in the CMOS substrate.

Figure 3B:
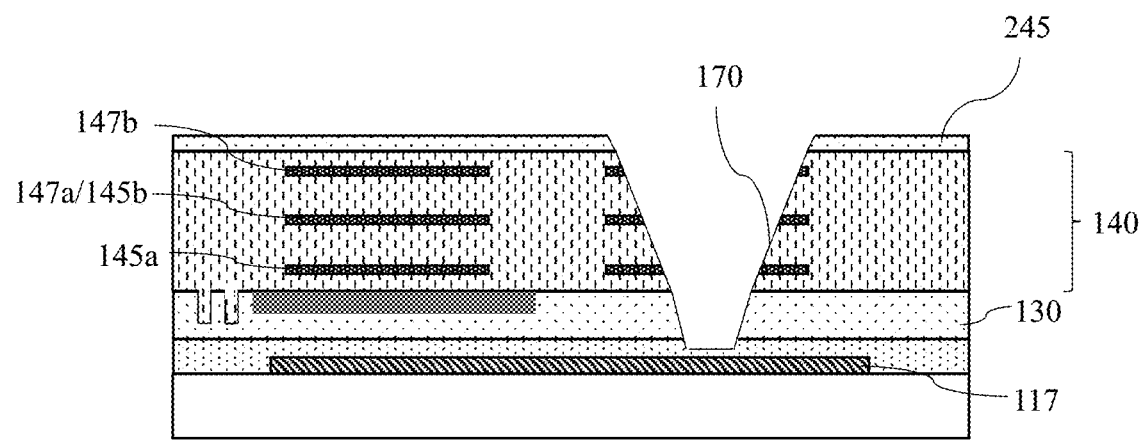

As shown in FIG. 3B, a via opening 170 may be formed to extend through the first electrode 145a, the middle electrode 147a/145b and the second electrode 147b in the device layer 140. A first etch may be performed through the etch stop layer 245, the device layer 140 and the interposer layer 130 to form the via opening 170. The first etch may etch through the conductive elements (e.g., first electrode 145a, the middle electrode 147a/145b and the second electrode 147b) in the device layer 140 to expose the electrodes. The first etch may be performed using a sixth mask (not illustrated). The first etch may leave some dielectric layer remaining over the interconnect 117 of the first device 110 (e.g., CMOS substrate). The remaining dielectric layer may have a thickness of about 100 nm, in a non-limiting example.

Figure 3C:
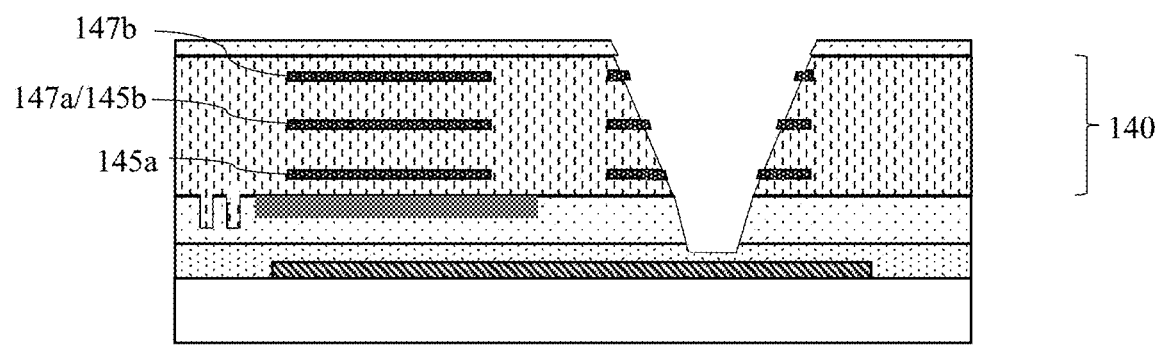
Figure 3D:
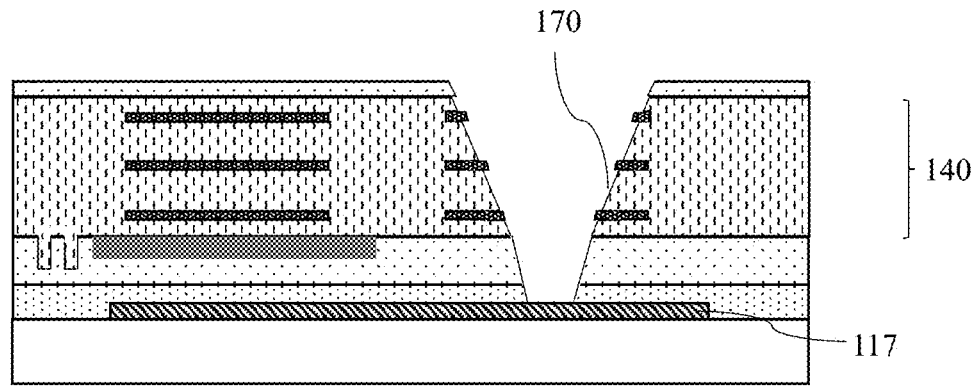

As illustrated in FIG. 3B, at least the sidewalls of the first electrode 145 and the second electrode 147 are exposed in the via opening 170. In some embodiments, exposed surfaces of the electrodes (e.g., first electrode 145a, the middle electrode 147a/145b and the second electrode 147b) by the via opening 170 may be increased by removing additional piezoelectric material from the piezoelectric stack. In a non-limiting example, an isotropic etch may be performed to remove the additional piezoelectric material from the piezoelectric stack, forming protruded portions of the first electrode 145a, the middle electrode 147a/145b and the second electrode 147b in the via opening 170, as illustrated in FIG. 3C. A second etch may be further performed to expose the interconnect 117 of the first device 110 (e.g., CMOS substrate), as shown in FIG. 3D. The sixth mask may be removed after the via opening 170 extends or reaches the interconnect 117 of the CMOS substrate. The via opening 170 may be referred to as a multi-level via of the monolithic integrated device.

As described, a single etch process and/or a single mask (e.g., the sixth mask) may be used for forming the via opening 170 in the device layer 140 (or the second device) which extends to the interconnect 117 (e.g., top metal) of the first device 110 (e.g., CMOS substrate). Accordingly, the via opening 170 may be formed with a relatively small width compared to conventional monolithic device fabrication processes. In a non-limiting embodiment, the via opening 170 may be formed with a small width such as less than about 9.2 um, in a non-limiting example.

Figure 3E:
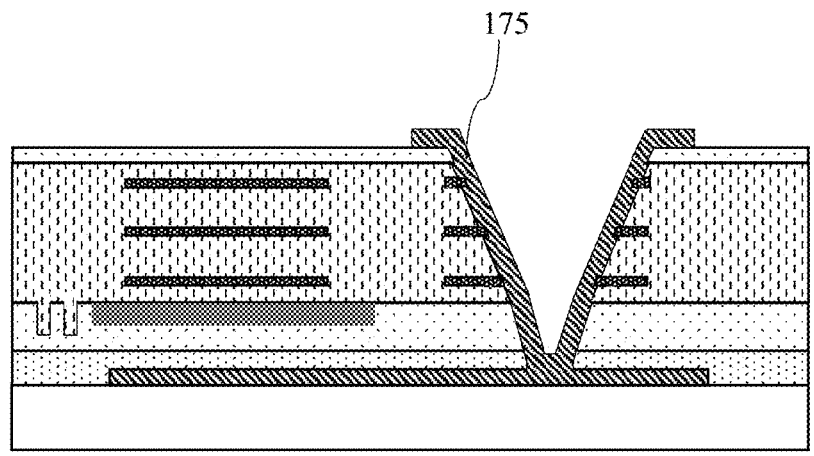

A conductive material may be deposited to line the via opening 170, as illustrated in FIG. 3E. The conductive material may be patterned, by etching using a seventh mask, forming the via contact 175.

Figure 3F:
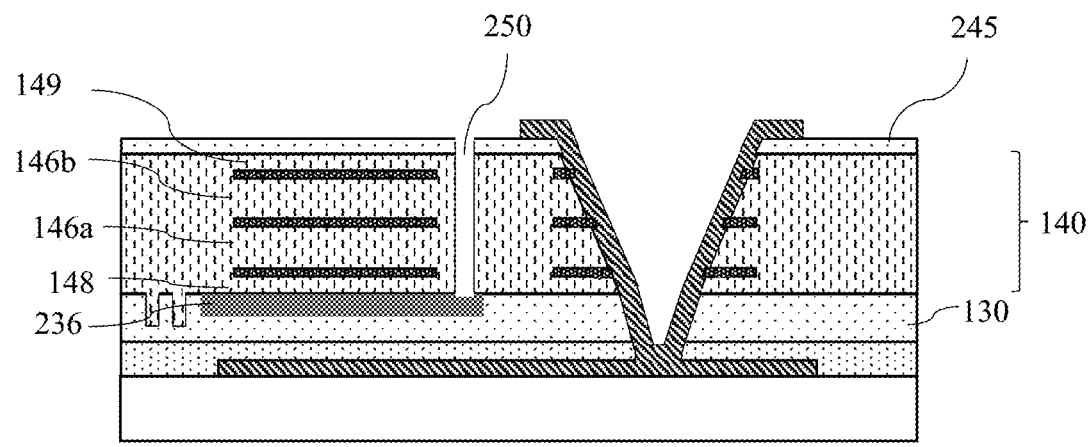
Figure 3G:
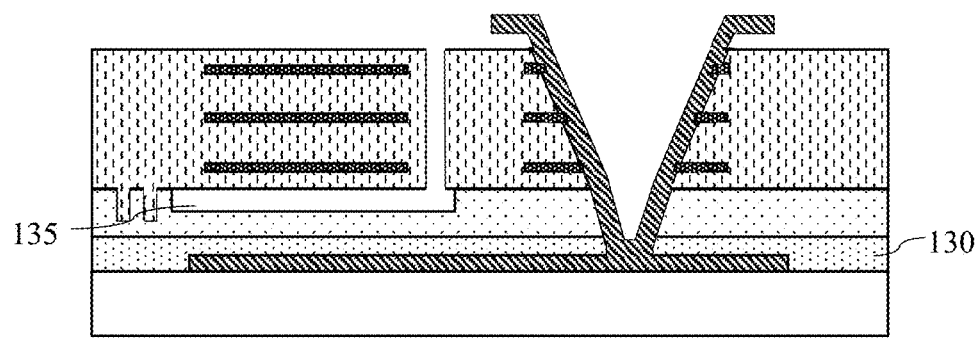

As illustrated in FIG. 3F, a release via 250 may be formed in the etch stop layer 245 and the device layer 140. The release via 250 may extend through a depth of the first and second piezoelectric stacks to expose the sacrificial layer 236. The release via 250 may be formed by etching through the buffer layer 149, the piezoelectric layers 146a and 146b, and the seed layer 148 using an eighth mask. Dielectric material in the interposer layer 130 may also be removed so as to expose the sacrificial layer. A release etch may then be performed to remove the sacrificial layer, forming the device cavity 135 in the interposer layer 130 as shown in in FIG. 3G. The etch stop layer 245 may be removed during the release etch.

Figure 3H:
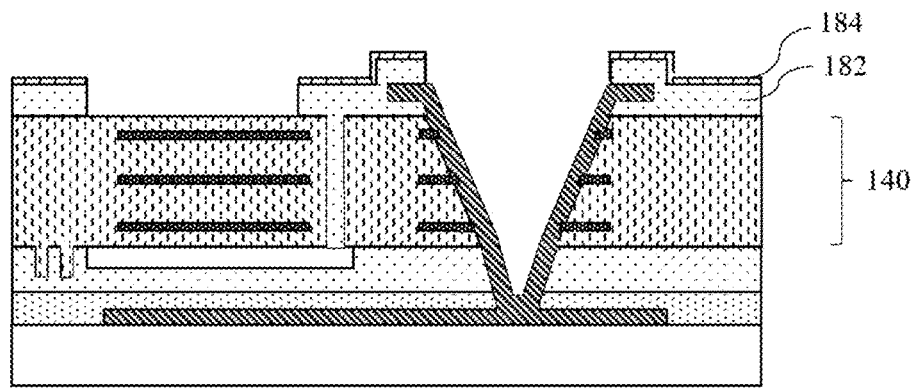

A passivation layer 182 and a capping layer 184 may be formed over the device layer 140, as shown in FIG. 3H. The passivation layer 182 may be formed by depositing a passivation material over the device layer 140 and the release via 250. The passivation material may at least partially fill the release via 250. Accordingly, the passivation layer 182 may seal the release via 250. The passivation material may be deposited such that it does not fill the device cavity 135. The capping layer 184 may be formed by depositing piezoelectric material over the passivation material. For example, the piezoelectric material may be deposited to a thickness of about 20 nm, and patterned by etching using a ninth mask. The passivation layer 182 may be patterned to expose the via contact 175 by etching the passivation material using the ninth mask. The passivation layer 182 may be patterned using a short VHF etch process, in a non-limiting example. The passivation layer 182 may surround portions of the via contact 175 extending outside the via opening 170.

FIGS. 4A-4F show simplified cross-sectional views of embodiments of yet another process 400 for forming a device. The device, for example, is similar or the same as that shown and described in FIG. 1D, and the process 400 may be similar to the processes 200 and 300 as described above. As such, common elements may not be described or described in detail.

Figure 4A:
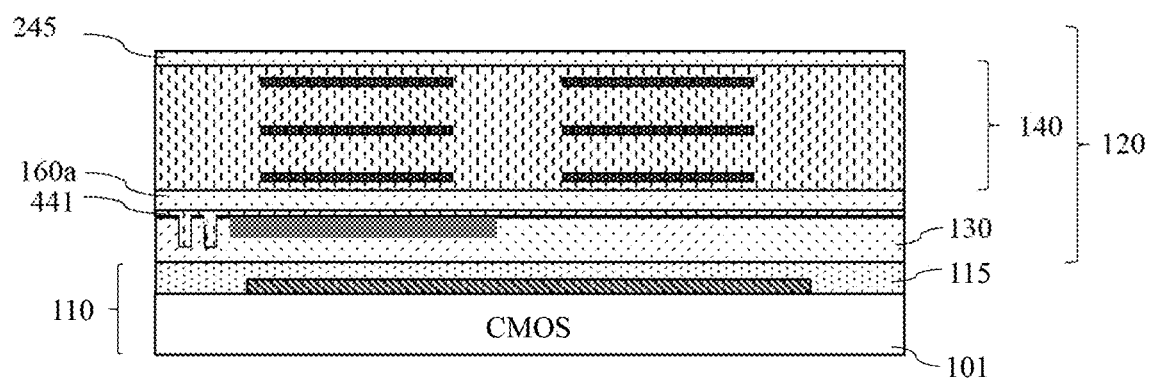
FIGS. 4A-4F show simplified cross-sectional views of embodiments of yet another process for forming a device.

The MEMS component formed over the first device 110 may include a first elastic layer 160*a* formed below the device layer 140, as shown in FIG. 4A. A barrier layer 441 may be formed below the first elastic layer 160*a*. The barrier layer 441 may be provided to stop or prevent release on the first elastic layer 160*a* during a release process. In a non-limiting example, the barrier layer 441 may be formed of AlN, aluminum oxide ($Al_2O_3$), or combinations thereof. The process for forming the interposer layer 130 and the device layer 140 may include using five masks, in a non-limiting example. An etch stop layer 245 may be formed over the device layer 140.

Figure 4B:
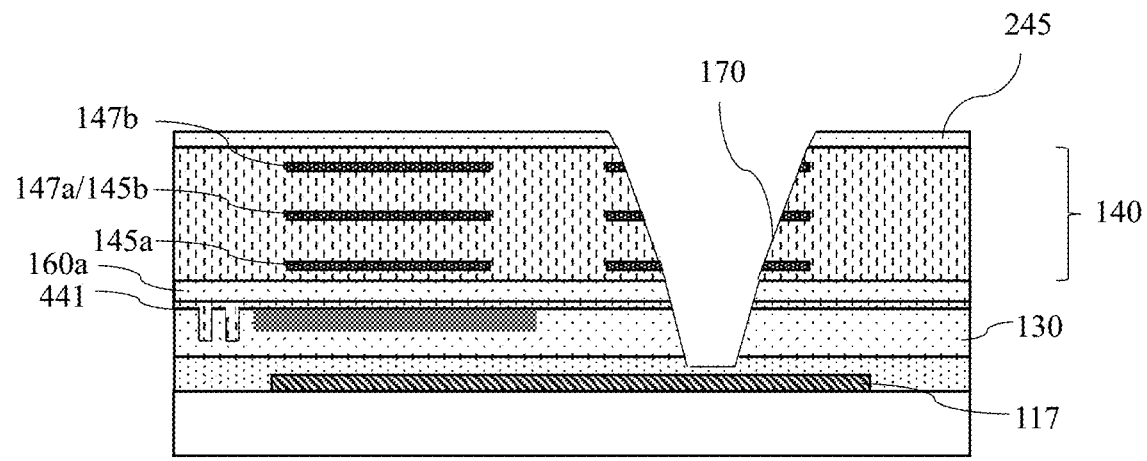
Figure 4C:
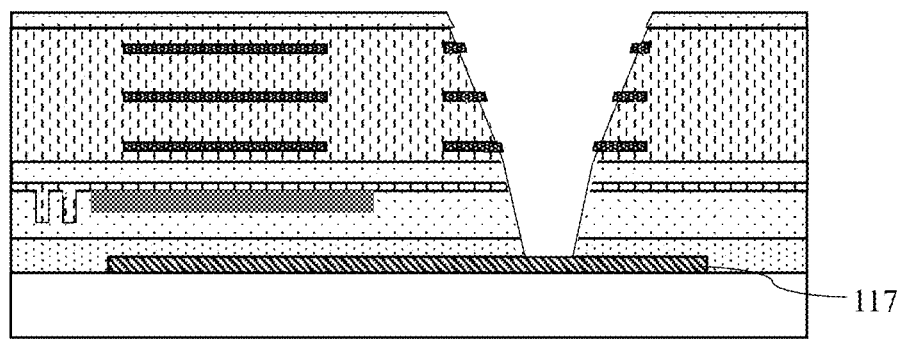

Similarly, one or more via contacts may be formed in the device layer 140 to electrically connect the electrodes 145*a*, 147*a*/145*b*, 147*b* of the device layer 140 to the interconnect 117 in the CMOS substrate. As shown in FIG. 4B, a via opening 170 may be formed to extend through the first electrode 145*a*, the middle electrode 147*a*/145*b* and the second electrode 147*b* in the device layer 140. A first etch may be performed through the etch stop layer 245, the device layer 140, the first elastic layer 160*a*, the barrier layer 441 and the interposer layer 130 to form the via opening. The first etch may etch through the conductive elements (e.g., first electrode 145*a*, the middle electrode 147*a*/145*b* and the second electrode 147*b*) in the device layer 140 to expose the conductive elements. The first etch may be performed using a sixth mask (not illustrated). As illustrated in FIG. 4B, at least the sidewalls of the first electrode 145 and the second electrode 147 are exposed in the via opening 170. In some embodiments, exposed surfaces of the electrodes (e.g., first electrode 145*a*, the middle electrode 147*a*/145*b* and the second electrode 147*b*) by the via opening 170 may be increased by removing additional piezoelectric material from the piezoelectric stack, forming protruded portions of the first electrode 145*a*, the middle electrode 147*a*/145*b* and the second electrode 147*b* in the via opening 170 as illustrated in FIG. 4C. A second etch may be further performed to expose the interconnect 117 of the first device 110 (e.g., CMOS substrate). The sixth mask may be removed after the via opening 170 extends or reaches the interconnect 117 of the first device 110 (e.g., CMOS substrate).

Figure 4D:
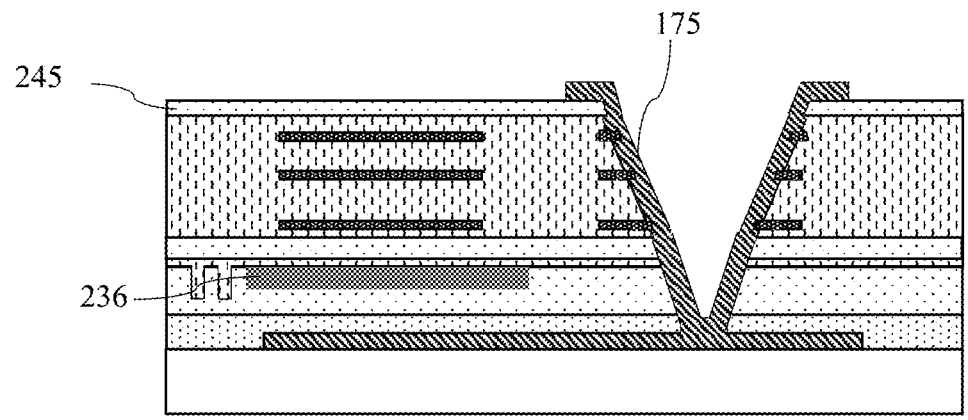
Figure 4E:
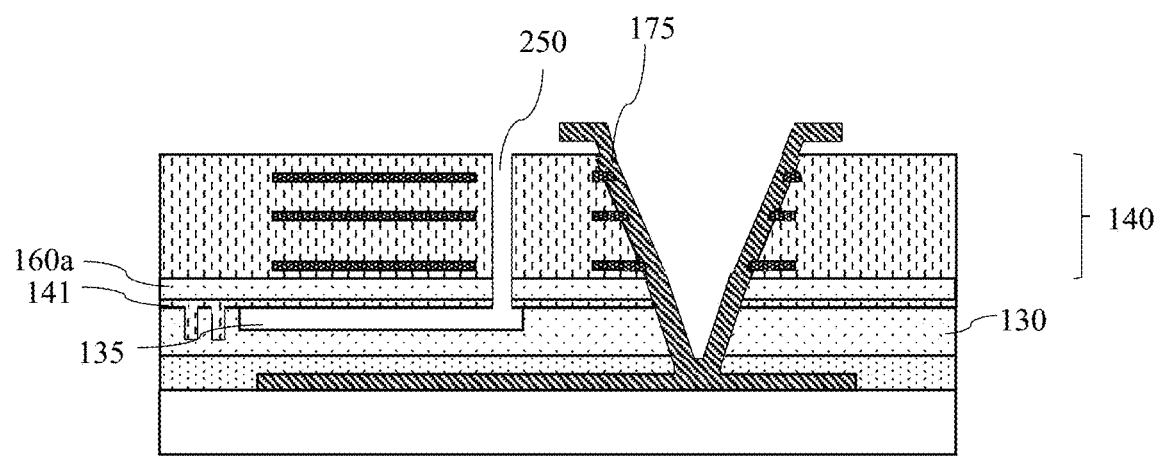

A conductive material may be deposited to line the via opening 170, as illustrated in FIG. 4D. The conductive material may be patterned, by etching using a seventh mask, forming the via contact 175.

A release via 250 may be formed in the etch stop layer 245 and the device layer 140. The release via 250 may extend through a depth of the device layer 140, the first elastic layer 160*a* and the additional seeding piezoelectric layer 141 to expose the sacrificial layer. The release via 250 may be formed by etching through the passivation layer 245, the buffer layer 149, the piezoelectric layers 146*a* and 146*b*, the seed layer 148, the first elastic layer 160*a* and the barrier layer 441 using an eighth mask. Dielectric material in the interposer layer 130 may also be removed so as to expose the sacrificial layer. A release etch may then be performed to remove the sacrificial layer, forming the device cavity 135 in the interposer layer 130 as shown in in FIG. 4E. The etch stop layer 245 may be removed during the release etch.

Figure 4F:
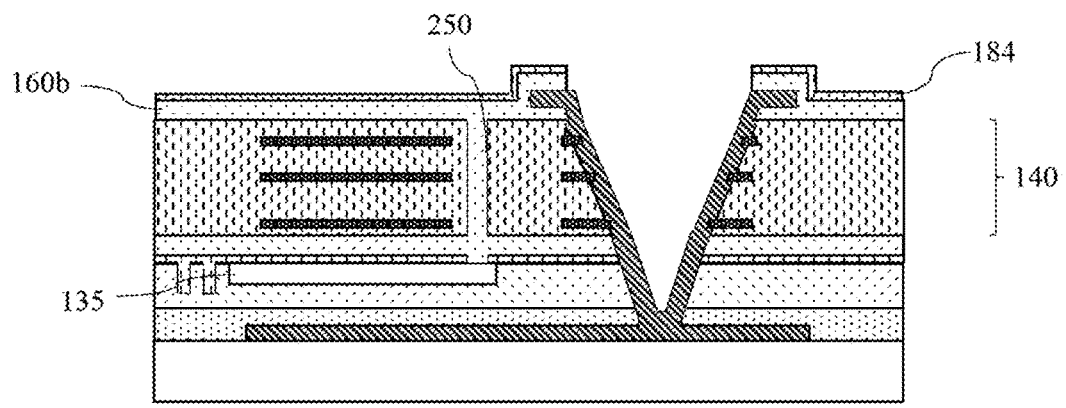

A second elastic layer 160*b* and a capping layer 184 may be formed over the device layer 140, as shown in FIG. 4F. The second elastic layer 160*b* may be formed by depositing an elastic material over the device layer 140 and the release via 250. The elastic material may at least partially fill the release via 250. Accordingly, the second elastic layer 160*b* may seal the release via 250. The elastic material may be deposited such that it does not fill the device cavity 135; said differently, the device cavity 135 may remain unfilled by the elastic material or any material so as to remain an empty space therein. The capping layer may be formed by depositing piezoelectric material over the elastic material. For example, the piezoelectric material may be deposited to a thickness of about 20 nm, and patterned by etching using a ninth mask. The second elastic layer 160*b* may be patterned to expose the via contact 175 by etching the elastic material using the ninth mask. The second elastic layer 160*b* may be patterned using a short VHF etch process, in a non-limiting example. The second elastic layer 160*b* may surround portions of the via contact 175 extending outside the via opening 170.

FIGS. 5A-5F show simplified cross-sectional views of embodiments of still another process for forming a device. The device, for example, is similar or the same as that shown and described in FIG. 1E, and the process 500 may be similar to the processes 200, 300 and 400 as described above. As such, common elements may not be described or described in detail.

Figure 5A:
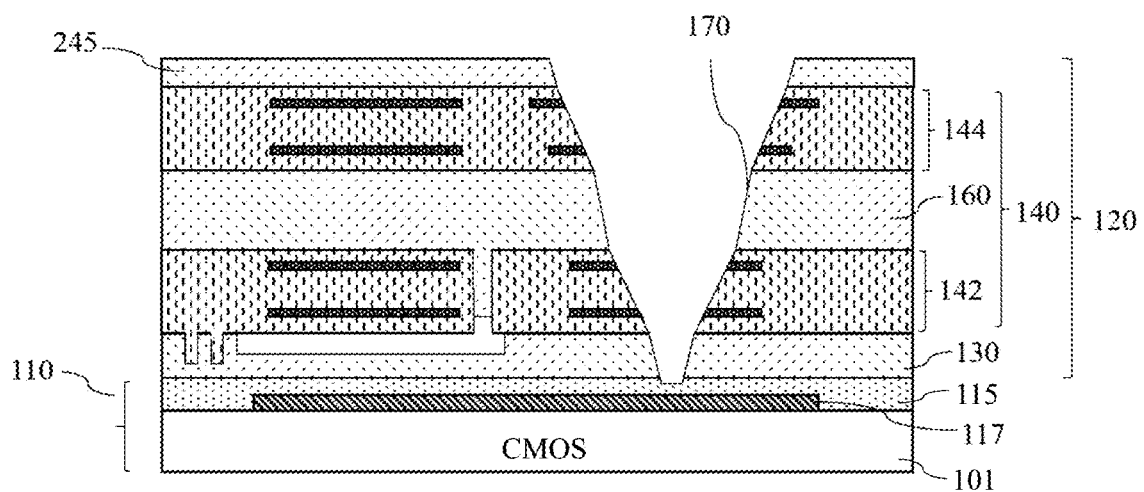
FIGS. 5A-5F show simplified cross-sectional views of embodiments of still another process for forming a device.

The MEMS component formed over the CMOS substrate may include an elastic layer 160 formed between the first piezoelectric stack 142 and the second piezoelectric stack 144 of the device layer 140, as shown in FIG. 5A. The process for forming the interposer layer 130 and the device layer 140 having the elastic layer arranged between the first and second piezoelectric stack may include seven masks, in a non-limiting example. An etch stop layer 245 may be formed over the device layer 140.

Similarly, one or more via contacts may be formed in the device layer to electrically connect the electrodes of the device layer 140 to the interconnect 117 in the CMOS substrate. As shown in FIG. 5A, a via opening 170 may be formed to extend through the first electrodes 145*a*, 145*b* and the second electrodes 147*a*, 147*b* in the device layer 140. A first etch may be performed through the etch stop layer 245, the second piezoelectric stack 144, the elastic layer 160, the first piezoelectric stack 142, and the interposer layer 130 to form the via opening. The first etch may etch through the electrodes (e.g., first electrodes 145*a*, 145*b* and the second electrodes 147*a*, 147*b*) in the device layer 140 to expose the electrodes. The first etch may be performed using an eight mask. The first etch may leave some dielectric layer remaining over the top metal of the CMOS substrate. The remaining dielectric layer may have a thickness of about 100 nm, in a non-limiting example. At least the sidewalls of the first electrodes 145*a*, 145*b* and the second electrodes 147*a*, 147*b* may be exposed in the via opening 170.

Figure 5B:
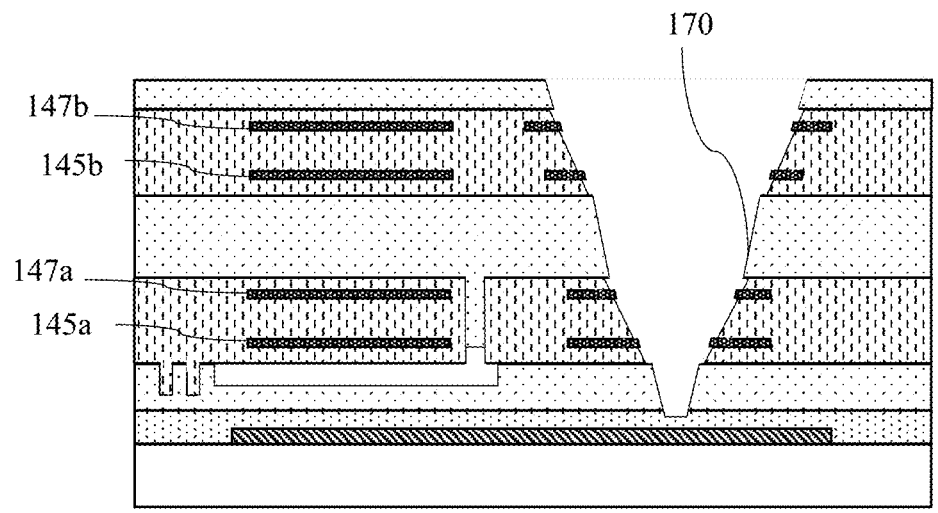
Figure 5C:
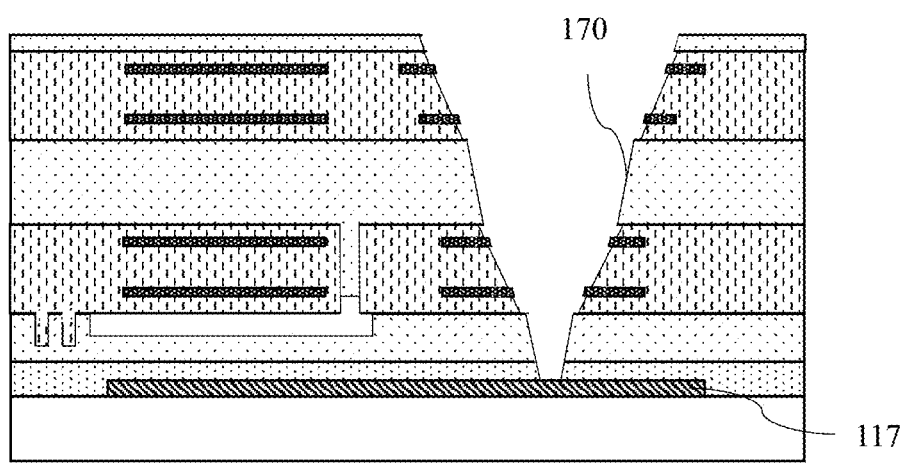

In some embodiments, exposed surfaces of the electrodes (e.g., first electrodes 145a, 145b and the second electrodes 147a, 147b) by the via opening 170 may be increased by removing additional piezoelectric material from the piezoelectric stack, forming protruded portions of the first electrodes 145a, 145b and the second electrodes 147a, 147b in the via opening 170 as illustrated in FIG. 5B. A second etch may be further performed to expose the interconnect 117 of the first device 110 (e.g.) CMOS substrate, as shown in FIG. 5C. The second etch removes the remaining dielectric layer over the interconnect 117 and extends a depth of the via opening 170. The eight mask may be removed after the via opening 170 extends or reaches the interconnect 117 of the first device 110 (e.g., CMOS substrate).

The via opening 170 may be referred to as a multi-level via of the monolithic integrated device (e.g., four levels of electrodes 145a, 145b, 147a, 147b of the device layer connected to the interconnect 117 by the same via). As described, a single etch process and/or single mask (e.g., the eighth mask) may be used for forming the via opening 170 in the device layer (or the second device) which extends to the interconnect 117 (e.g., top metal) of the first device. Accordingly, the via opening 170 may be formed with a relatively small width compared to conventional fabrication processes. In a non-limiting embodiment, the via opening 170 may be formed with a small width such as about 9.2 um, in a non-limiting example.

Figure 5D:
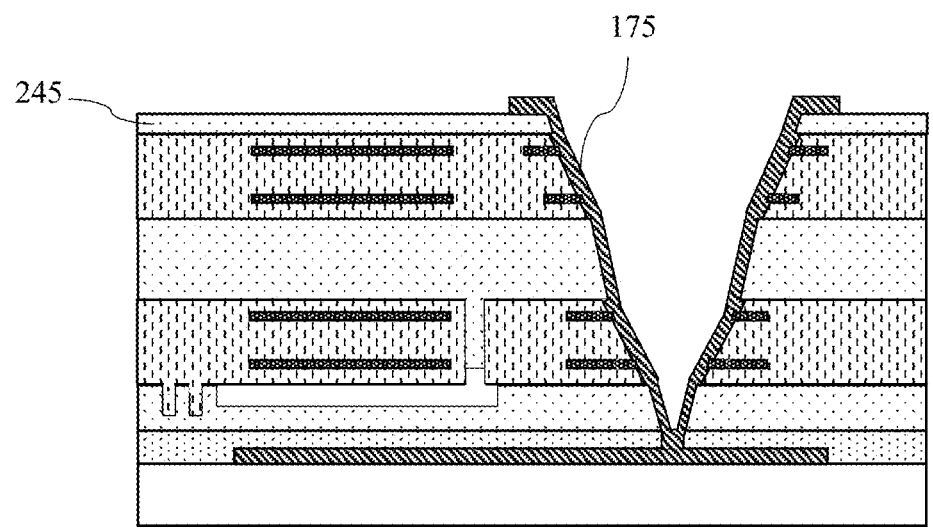
Figure 5E:
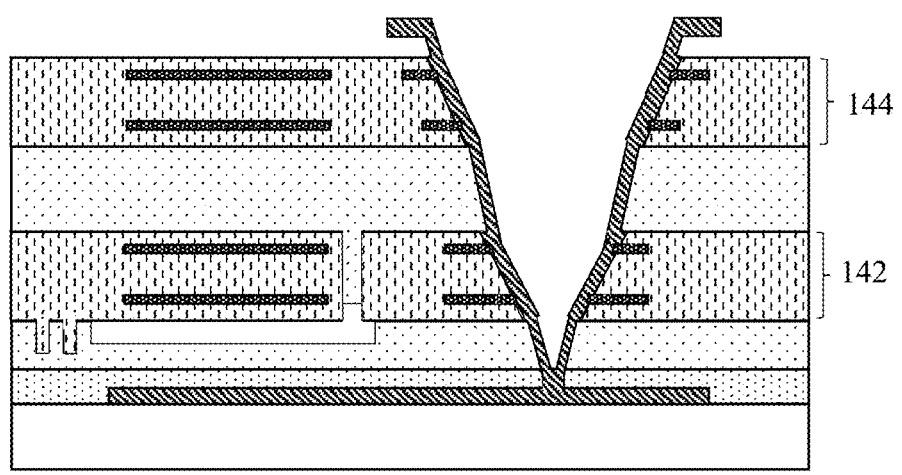

A conductive material may be deposited to line the via opening 170, as illustrated in FIG. 5D. The conductive material may be patterned, by etching using a ninth mask, forming the via contact 175. The etch stop layer 245 may be removed, exposing a top surface of second piezoelectric stack 144 as illustrated in FIG. 5E.

As described, the process 500 may form the MEMS component (or second device) without performing CMP during fabrication of the first piezoelectric stack and the second piezoelectric stack, as well as the elastic layer. For example, the via opening and via contact may be formed in the device layer after all the film deposition (e.g., formation of the first piezoelectric stack and the second piezoelectric stack as well as the elastic layer).

Figure 5F:
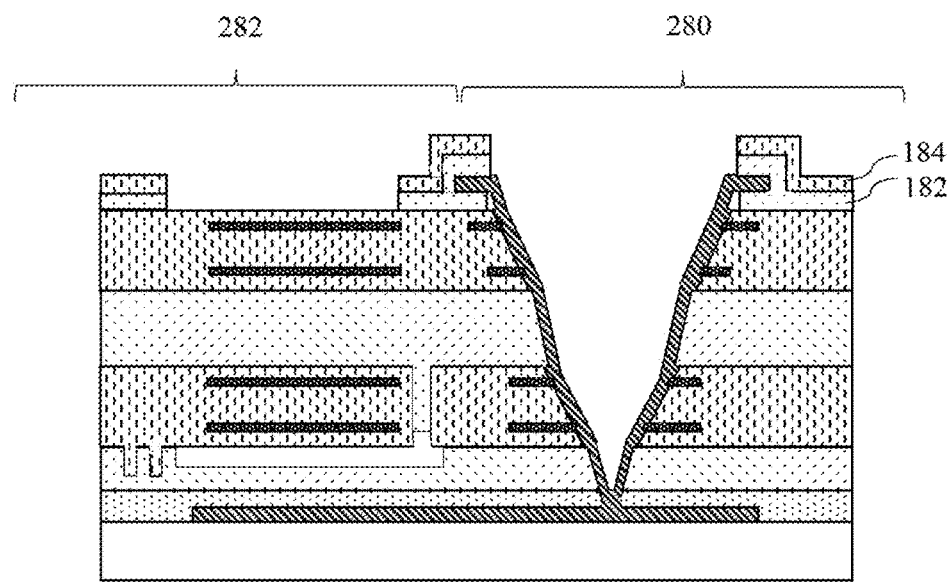

The process may continue to form a passivation layer 182 and a capping layer 184 over the device layer, as illustrated in FIG. 5F. The passivation layer 182 and the capping layer 184 may surround portions of the via contact 175 extending outside the via opening 170. For example, the passivation layer 182 may be deposited over the device layer, followed by the capping layer 184. The passivation layer 182 and the capping layer 184 may be patterned, by etching using a tenth mask. For example, the capping layer 184 may be etched first, followed by the passivation layer 182. The passivation layer 182 may be patterned using a short VHF etch process, in a non-limiting example.

FIGS. 6A-6E show simplified cross-sectional views of embodiments of a process for forming a device. The device, for example, may be similar or the same as that shown and described in FIG. 1B, and the process 600 may be similar to the processes 200, 300, 400 and 500 as described above. For example, the second device 120 formed over the first device 110 may include an interposer layer 130 and a device layer 140.

Figure 6A:
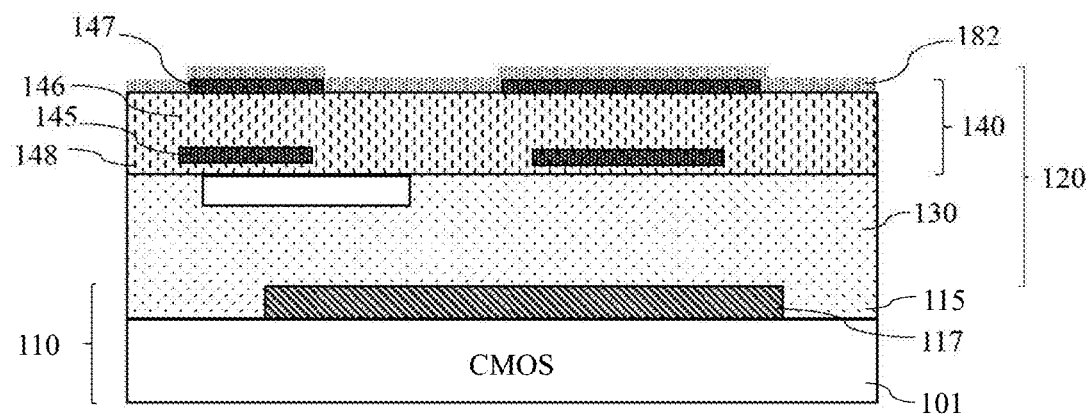
FIGS. 6A-6E show simplified cross-sectional views of embodiments of a process for forming a device.

As shown in FIG. 6A, the device layer 140 may include a seed layer 148, a first electrode 145, a piezoelectric layer 146, a second electrode 147, and a passivation layer 182. In other embodiments, the seed layer 148 may not be formed.

According to various embodiments, a via opening may be formed through the device layer 140 and the interposer layer 130 such that the via opening has different widths at different levels of the second device 120. For example, the via opening may be formed to extend through the first electrode 145 and the second electrode 147 in the piezoelectric stack. The via opening may be formed by etching the layers of the second device 120 sequentially using different sized reticles.

Figure 6B:
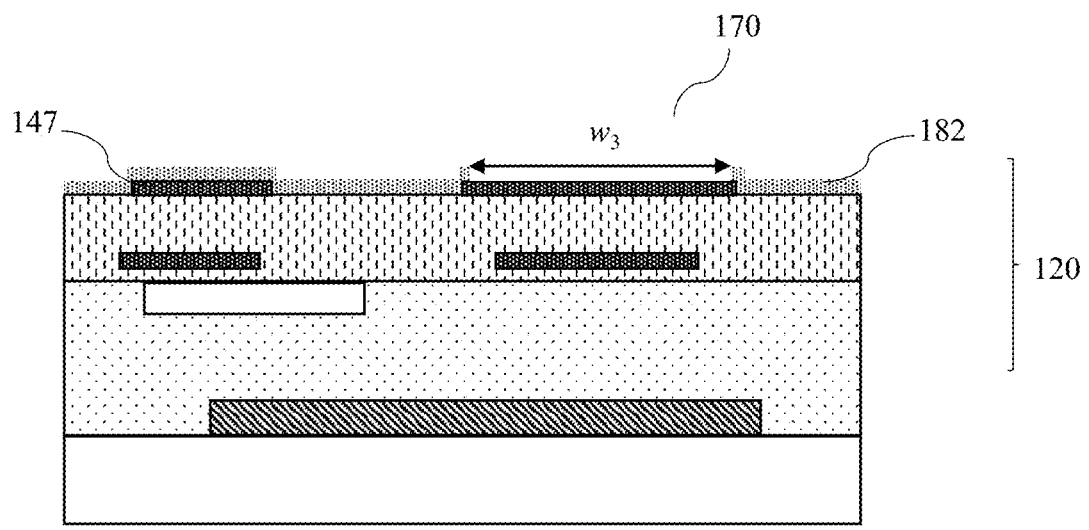
Figure 6C:
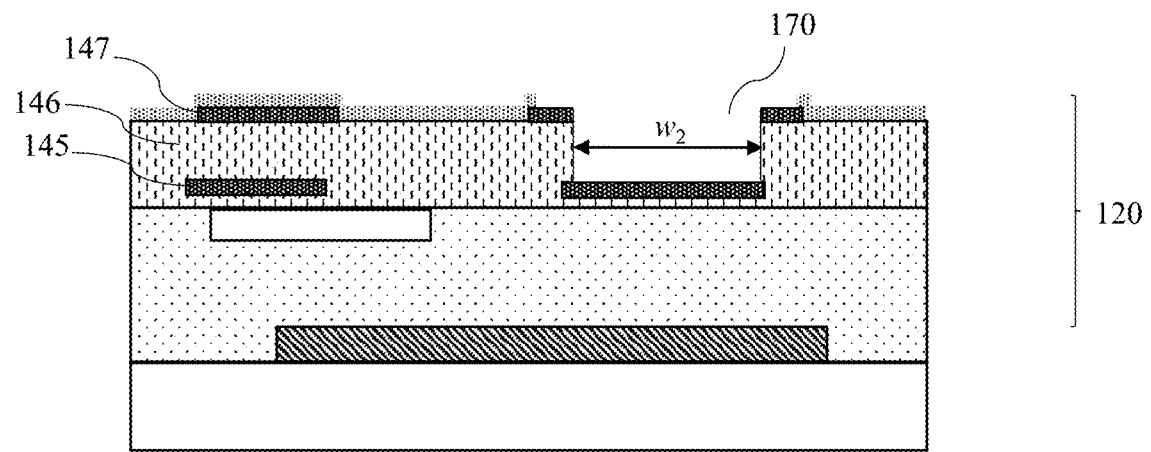
Figure 6D:
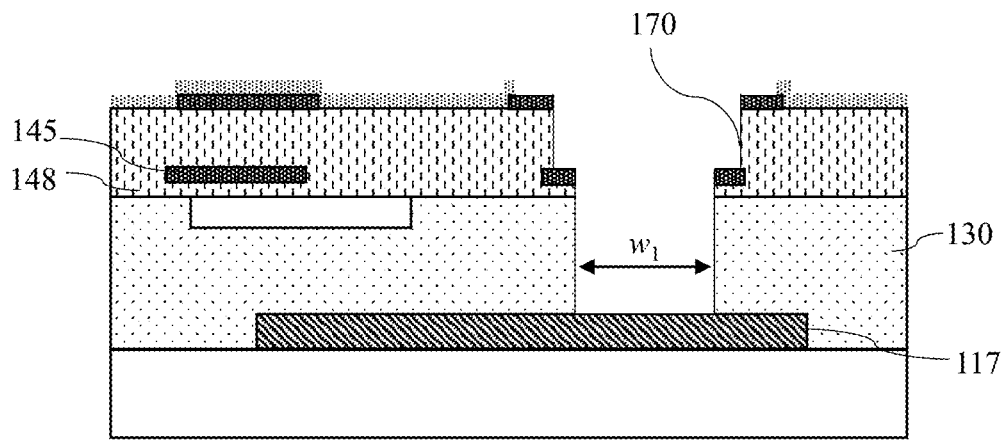

A first etch may be performed using a first reticle to open the via opening 170 for the second electrode 147 (e.g., exposing a portion of the top surface of the second electrode 147). The first etch may etch through the passivation layer 182 to expose the top surface of the second electrode 147, as shown in FIG. 6B. For example, the first etch forms a third via width $w_3$ of the via opening 170. A second etch may be performed using a second reticle to open the via opening 170 for the first electrode 145 (e.g., exposing a portion of the top surface of the first electrode 145). The second etch may etch through the second electrode 147 and the piezoelectric layer 146 to expose the top surface of the first electrode 145, as shown in FIG. 6C. For example, the second etch forms a second via width $w_2$ of the via opening 170. The second via width $w_2$ of the via opening 170 exposes sidewalls of the second electrode 147 and the top surface of the first electrode 145. A third etch may be performed using a third reticle to open the via opening 170 for the interconnect 117 (e.g., exposing a portion of the top surface of the interconnect 117). The third etch may etch through the first electrode 145, the seed layer 148 and the interposer layer 130 to expose the top surface of the interconnect 117, as shown in FIG. 6D. For example, the third etch forms a first via width $w_1$ of the via opening 170. The first via width $w_1$ of the via opening 170 exposes sidewalls of the first electrode 145 and the top surface of the interconnect 117.

Figure 6E:
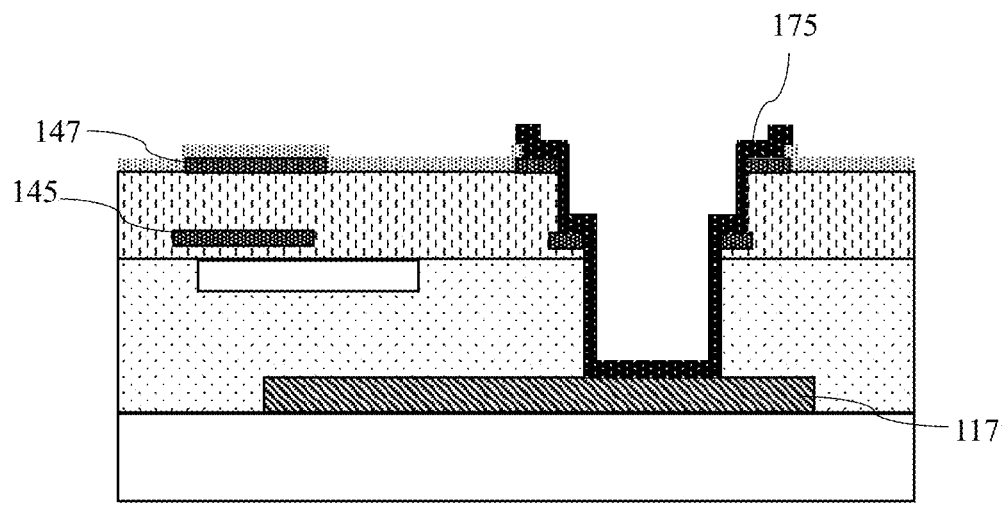

A conductive material may be deposited to line the via opening 170. The conductive material may be patterned, forming the via contact 175 as illustrated in FIG. 6E. The via contact may be formed in the device layer 140 (or the second device 120) to electrically connect the electrodes 145 and 147 of the device layer 140 to the interconnect 117 in the CMOS substrate.

Similar to the processes 200, 300, 400 and 500, the process 600 may form one or more via openings 170 in a via region adjacent to a device area/region of the monolithic integrated device, and respective via contacts 175 in the via openings.

In some embodiments, the via opening 170 may include at least one extension region to increase a contact area of at least one of the first electrode and the second electrode for the via contact 175.

Figure 7A:
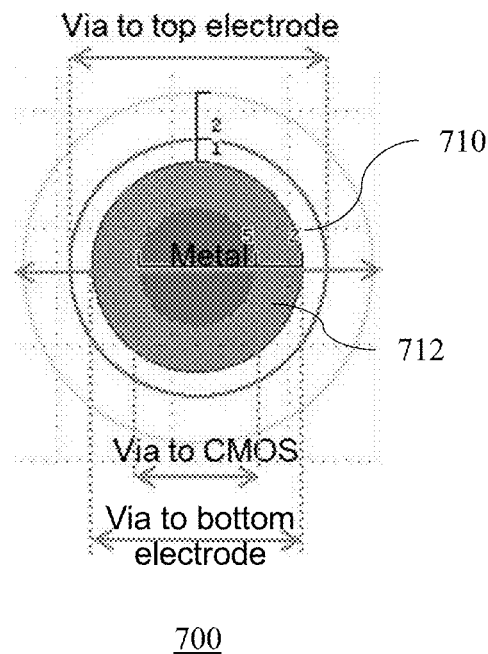
Figure 7B:
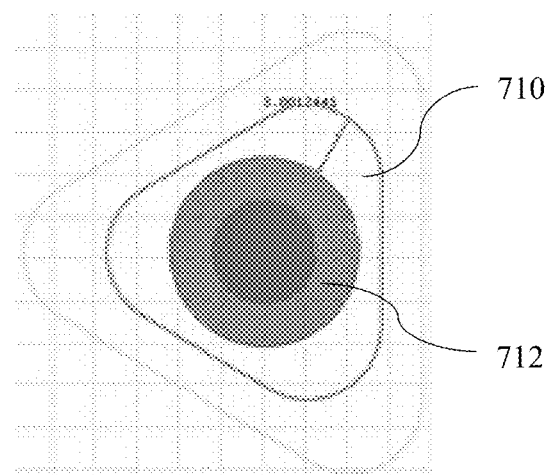
FIGS. 7B-7C show exemplary top views of via designs of a via opening where at least one extension region is provided in the via opening.
Figure 7C:
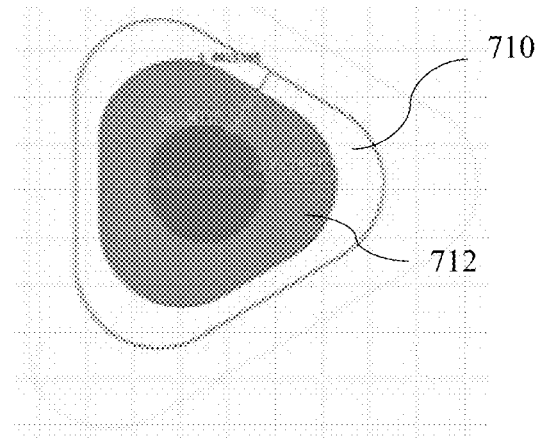

FIG. 7A shows an exemplary top view of a via design of a via opening 700 based on existing design rule. As illustrated, the contact areas 710 and 712 for the top electrode and bottom electrode (or first conductive element and second conductive element), respectively, may be limited. The contact area may be even smaller due to a sloped etch angle. FIG. 7B shows an exemplary top view of a via design of a via opening 701 where an extension region is provided in the via opening for the top electrode (or second conductive element), which increases the contact area 710 for the top electrode. In other words, the extension region is provided in the via opening at the level of the top electrode. FIG. 7C shows another exemplary top view of a via design of a via opening 702 where extension regions are provided in the via opening for the top electrode and bottom electrode (first conductive element and second conductive element), which increases the contact area 710 for the top electrode and the contact area 712 for the bottom electrode. In other words, the extension region is provided in the via opening at the level of the top electrode and at the level of the bottom electrode.

Figure 8A:
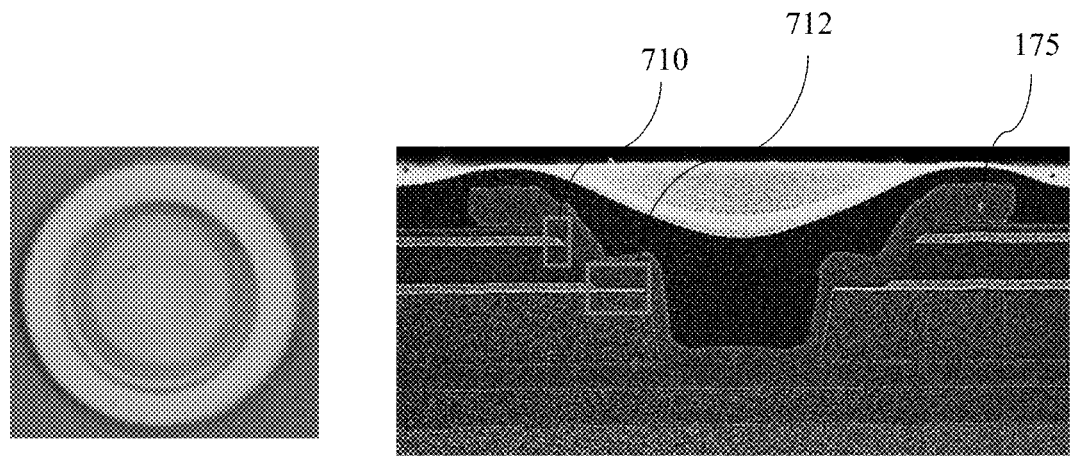
Figure 8B:
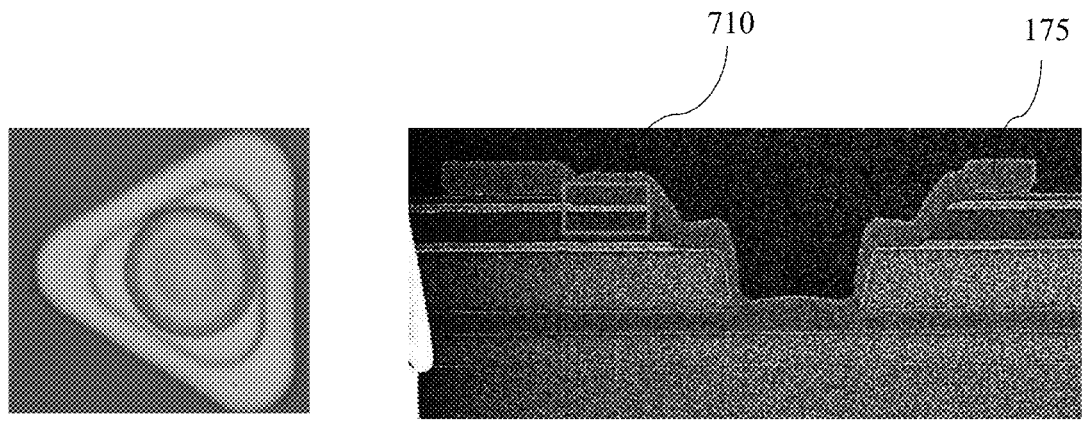
FIGS. 8B-8C show exemplary top and side views of via openings having at least one extension region.
Figure 8C:
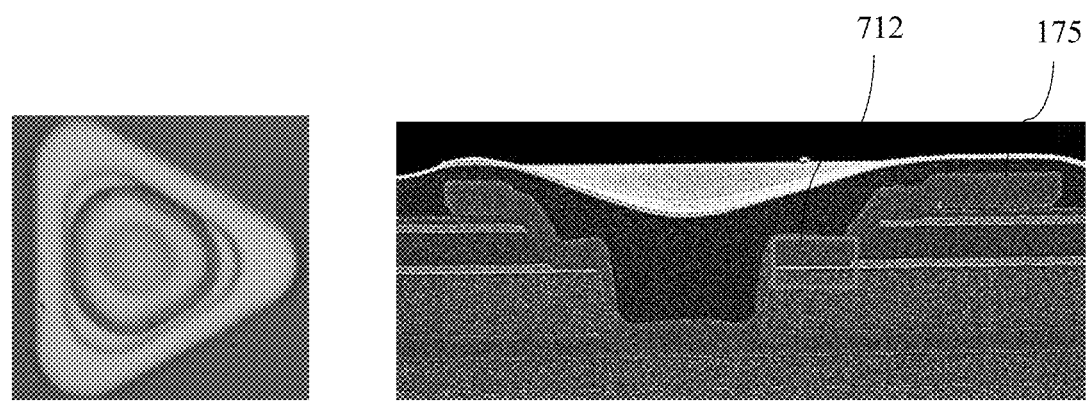

FIG. 8A shows exemplary top 800*a* and side 800*b* views of a via opening 800 based on existing design rule, and via contact 175 arranged therein. In a non-limiting example, the contact area 710 for the top electrode to the via contact 175 may be about 0.7 um, while the contact area 712 for the bottom electrode to the via contact 175 may be about 1.7 um. FIG. 8B shows exemplary top 801*a* and side 801*b* views of a via opening 801 having an extension region at the top electrode level, increasing the contact area 710 for the top electrode to the via contact 175. In a non-limiting example, the contact area 710 for the top electrode to the via contact 175 may be about 2.3 um. FIG. 8C shows exemplary top 802*a* and side 802*b* views of a via opening 802 having two extension regions such as at the top and bottom electrode level respectively, increasing the contact areas 710 and 712 for the top electrode and bottom electrode, respectively, to the via contact 175. In a non-limiting example, the contact area 712 for the bottom electrode to the via contact 175 may be increased to about 2.3 um.

Figure 9A:
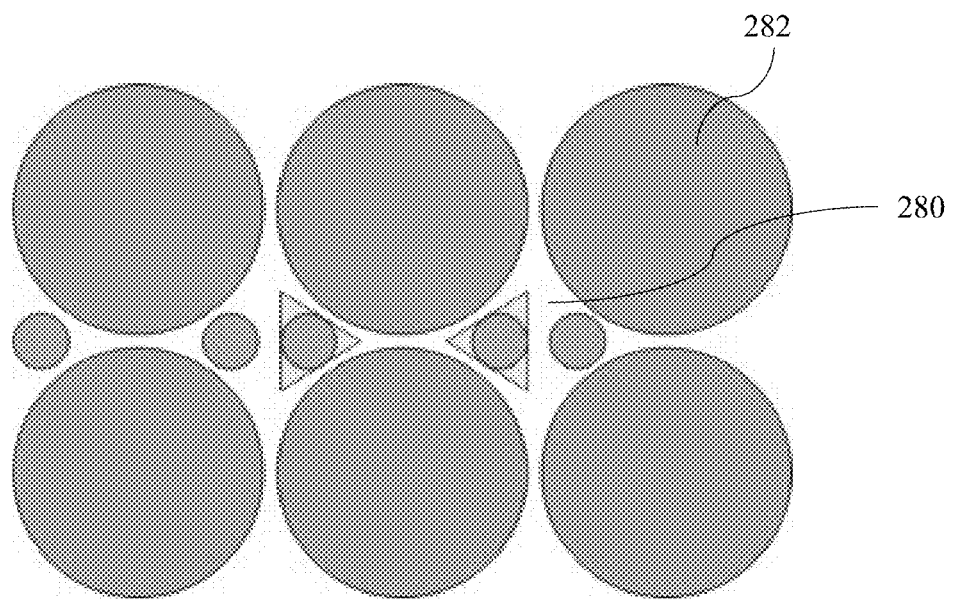
FIGS. 9A-9B show exemplary schematic views illustrating via openings having extension regions in various configurations.
Figure 9B:
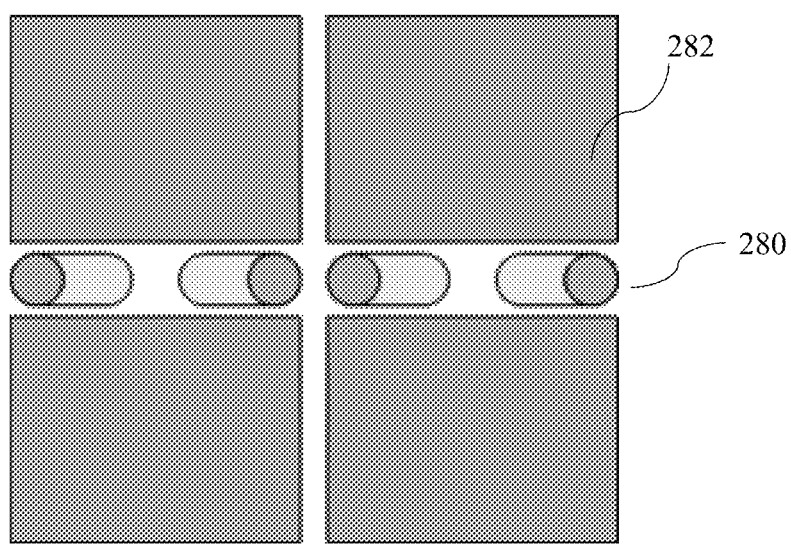

The via opening having the extension region may have a triangle configuration or shape. In other embodiments, the via opening having the extension region may have a flat oval configuration. FIGS. 9A-9B show exemplary schematic views illustrating via openings having the extension region in various shapes in the via region 282 adjacent to the device region 280. Other types of configuration or shape may also be used to maximize the contact area for the electrodes. Accordingly, the via contact arranged in the via opening may be a multi-layer via contact having additional contact area afforded by the extension region(s). For example, the via contact may have additional contact area in the corners (or extension region) of the via opening. Accordingly, the via contact may have lower contact resistance compared to existing vias in integrated stacked devices such as a MEMS component stacked over a CMOS substrate.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A monolithic integrated device, comprising:
a first device comprising an interconnect and an interlevel dielectric layer surrounding the interconnect, the interconnect comprising a contact pad or a top metal of the first device;
a second device arranged over the first device, wherein the second device comprises:
a first conductive element; and
a second conductive element arranged over the first conductive element;
a via opening extending through the first conductive element and the second conductive element of the second device to the interconnect of the first device, wherein the via opening through the first conductive element has a first via width and the via opening through the second conductive element has a second via width wider than the first via width; and
a via contact arranged in the via opening to contact the first conductive element, the second conductive element, and the interconnect of the first device; wherein the via contact electrically connects the first conductive element and the second conductive element of the second device to the interconnect of the first device.

2. The monolithic integrated device of claim 1, wherein the via contact lines the via opening.

3. The monolithic integrated device of claim 1, wherein the first via width extends to the interconnect of the first device; wherein the second via width extends to a top surface of the first conductive element; and the via opening further comprising a third via width wider than the second via width extending to a top surface of the second conductive element.

4. The monolithic integrated device of claim 1, wherein the via opening further comprises at least one extension region to increase a contact area of at least one of the first conductive element and the second conductive element for the via contact.

5. The monolithic integrated device of claim 4, wherein the via opening having the at least one extension region comprises a triangular shape or a flat oval shape.

6. The monolithic integrated device of claim 1, further comprising one or more additional via openings arranged adjacent to a device area of the second device; and further comprising respective via contacts arranged therein.

7. The monolithic integrated device of claim 1, wherein the second device comprises a transducer.

8. The monolithic integrated device of claim 7, wherein the second device comprises a sensor and the first device comprises a complementary metal-oxide-semiconductor (CMOS) device which is a device fabricated using CMOS technology.

9. The monolithic integrated device of claim 1, wherein the first conductive element is a patterned bottom electrode, and wherein the second conductive element is a patterned top electrode.

10. The monolithic integrated device of claim 9, wherein the second device further comprises a piezoelectric layer arranged between the patterned top electrode and the patterned bottom electrode.

11. The monolithic integrated device of claim 10, wherein piezoelectric material of the piezoelectric layer is receded with respect to the first conductive element and the second conductive element in the via opening.

12. The monolithic integrated device of claim 1, wherein the second device further comprises a device layer disposed over an interposer layer, wherein the interposer layer is disposed over the interlevel dielectric layer of the first device.

13. The monolithic integrated device of claim 12, wherein the first conductive element is disposed in the device layer and second conductive element is disposed in or on the device layer with the first conductive element vertically spaced apart from the second conductive element.

14. The monolithic integrated device of claim 12, wherein the interposer layer of the second device is disposed in contact with the interlevel dielectric layer of the first device.

15. The monolithic integrated device of claim 12, wherein the first device further comprises a lower layer, and wherein the interconnect and the interlevel dielectric layer are arranged on the lower layer.

16. The monolithic integrated device of claim 3, wherein the via opening exposes the top surfaces and sidewalls of the first conductive element and/or the second conductive element.

17. A method of forming a monolithic integrated device, comprising:

providing a second device over a first device comprising an interconnect and an interlevel dielectric layer surrounding the interconnect, the interconnect comprising a contact pad or a top metal of the first device, wherein the second device comprises a first conductive element, and a second conductive element arranged over the first conductive element;

forming a via opening extending through the first conductive element and the second conductive element of the second device to the interconnect of the first device, wherein the via opening through the first conductive element has a first via width and the via opening through the second conductive element has a second via width wider than the first via width; and forming a via contact in the via opening to contact the first conductive element, the second conductive element, and the interconnect of the first device; wherein the via contact electrically connects the first conductive element and the second conductive element of the second device to the interconnect of the first device.

18. The method of claim 17, wherein the via contact lines the via opening.

19. The method of claim 17, wherein the first via width extends to the interconnect of the first device; wherein the second via width extends to a top surface of the first conductive element; and the via opening further comprising a third via width wider than the second via width to extend to a top surface of the second conductive element.

20. The method of claim 17, wherein the via opening further comprises at least one extension region to increase a contact area of at least one of the first conductive element and the second conductive element for the via contact.

* * * * *